United States Patent
Kaneko et al.

(10) Patent No.: US 9,472,720 B2
(45) Date of Patent: Oct. 18, 2016

(54) NITRIDE SEMICONDUCTOR WAFER, NITRIDE SEMICONDUCTOR ELEMENT, AND METHOD FOR MANUFACTURING NITRIDE SEMICONDUCTOR WAFER

(71) Applicant: KABUSHIKI KAISHA TOSHIBA, Minato-ku (JP)

(72) Inventors: Kei Kaneko, Kanagawa-ken (JP); Mitsuhiro Kushibe, Tokyo (JP); Hiroshi Katsuno, Ishikawa-ken (JP); Shinji Yamada, Ishikawa-ken (JP); Jumpei Tajima, Tokyo (JP); Yasuo Ohba, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/142,473

(22) Filed: Apr. 29, 2016

(65) Prior Publication Data

US 2016/0247968 A1 Aug. 25, 2016

Related U.S. Application Data

(62) Division of application No. 14/805,141, filed on Jul. 21, 2015, now Pat. No. 9,362,115, which is a division of application No. 14/175,199, filed on Feb. 7, 2014, now Pat. No. 9,184,242.

(30) Foreign Application Priority Data

Jun. 7, 2013 (JP) .................................. 2013-120863

(51) Int. Cl.
*H01L 31/0328* (2006.01)
*H01L 33/12* (2010.01)
(Continued)

(52) U.S. Cl.
CPC ........... *H01L 33/12* (2013.01); *H01L 21/0251* (2013.01); *H01L 21/0254* (2013.01);
(Continued)

(58) Field of Classification Search
CPC .............. H01L 21/02458; H01L 21/02505; H01L 21/0251; H01L 29/2003; H01L 29/201; H01L 29/36; H01L 29/157
USPC ............... 257/14, 15, 20, 22, 190, 191, 192; 438/87, 94, 172, 181
See application file for complete search history.

(56) References Cited

U.S. PATENT DOCUMENTS

2006/0226412 A1 10/2006 Saxler et al.
2008/0217645 A1 9/2008 Saxler et al.
(Continued)

FOREIGN PATENT DOCUMENTS

JP 2003-197962 7/2003
JP 2004-048076 2/2004
(Continued)

*Primary Examiner* — Matthew E Warren
(74) *Attorney, Agent, or Firm* — Oblon, McClelland, Maier & Neustadt, L.L.P.

(57) ABSTRACT

A nitride semiconductor wafer includes a silicon substrate, a first layer, a second layer, a third layer, a fourth layer, a fifth layer, and a sixth layer. The first layer is provided on the silicon substrate. The second layer is provided on the first layer. The third layer is provided on the second layer. The fourth layer is provided on the third layer. The fifth layer is provided on the fourth layer. The sixth layer is provided on the fifth layer. A composition ratio $x4$ of the fourth layer decreases in a first direction from the third layer toward the fifth layer. A maximum value of the composition ratio $x4$ is not more than a composition ratio of the third layer. A minimum value of the composition ratio $x4$ is not less than a composition ratio of the fifth layer.

16 Claims, 19 Drawing Sheets

(51) Int. Cl.
*H01L 33/00* (2010.01)
*H01L 33/06* (2010.01)
*H01L 33/32* (2010.01)
*H01L 29/15* (2006.01)
*H01L 29/20* (2006.01)
*H01L 21/02* (2006.01)
*H01L 29/201* (2006.01)
*H01L 29/36* (2006.01)

(52) U.S. Cl.
CPC ..... *H01L21/0262* (2013.01); *H01L 21/02381* (2013.01); *H01L 21/02458* (2013.01); *H01L 21/02505* (2013.01); *H01L 29/154* (2013.01); *H01L 29/157* (2013.01); *H01L 29/201* (2013.01); *H01L 29/2003* (2013.01); *H01L 29/36* (2013.01); *H01L 33/007* (2013.01); *H01L 33/06* (2013.01); *H01L 33/32* (2013.01)

(56) References Cited

U.S. PATENT DOCUMENTS

| | | |
|---|---|---|
| 2008/0220555 A1 | 9/2008 | Saxler et al. |
| 2009/0032833 A1 | 2/2009 | Nam |
| 2012/0292632 A1 | 11/2012 | Shioda et al. |
| 2013/0334495 A1 | 12/2013 | Lim et al. |
| 2014/0084296 A1 | 3/2014 | Yoshida et al. |
| 2014/0209862 A1* | 7/2014 | Ikuta ................ H01L 29/66462 257/22 |
| 2014/0353587 A1* | 12/2014 | Hoteida ............ H01L 21/02381 257/22 |

FOREIGN PATENT DOCUMENTS

| | | |
|---|---|---|
| JP | 2008-536332 | 9/2008 |
| JP | 2009-530808 | 8/2009 |
| JP | 2010-521064 | 6/2010 |
| JP | 2010-521065 | 6/2010 |
| JP | 2012-256833 | 12/2012 |
| JP | 2014-067908 | 4/2014 |

* cited by examiner

FIG. 3A
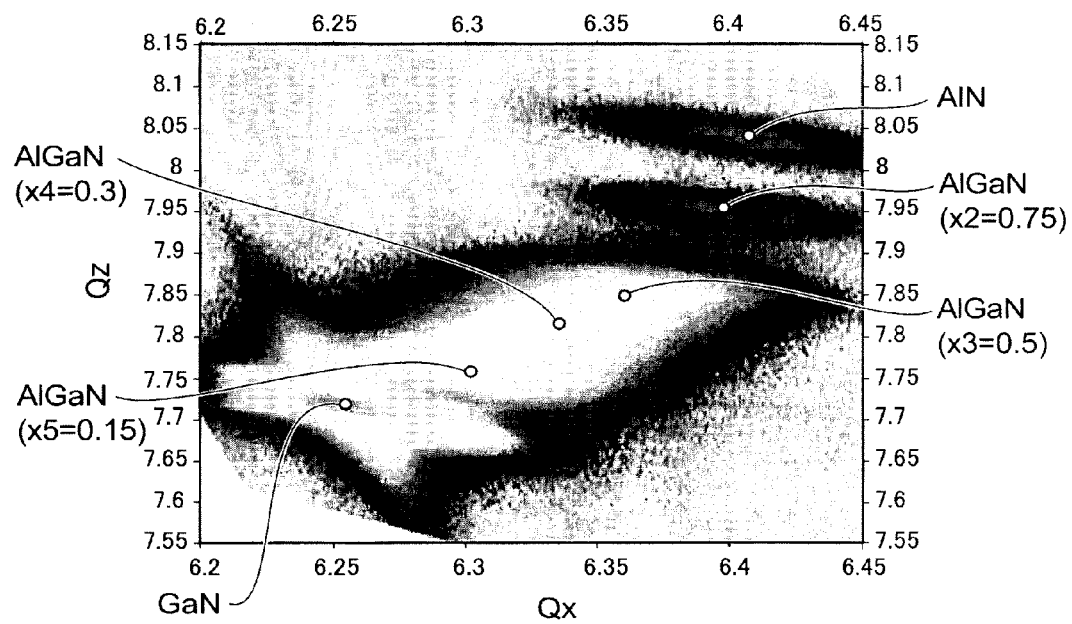
FIG. 3B
|  | SR | LM (%) |
|---|---|---|
| GaN | 0.8 | 0.69 |
| Al 15% | 0.59 | 0.53 |
| Al 30% | 0.47 | 0.39 |
| Al 50% | 0.53 | 0.6 |
| Al 75% | 0.29 | 0.15 |
| AlN |  |  |
FIG. 3C
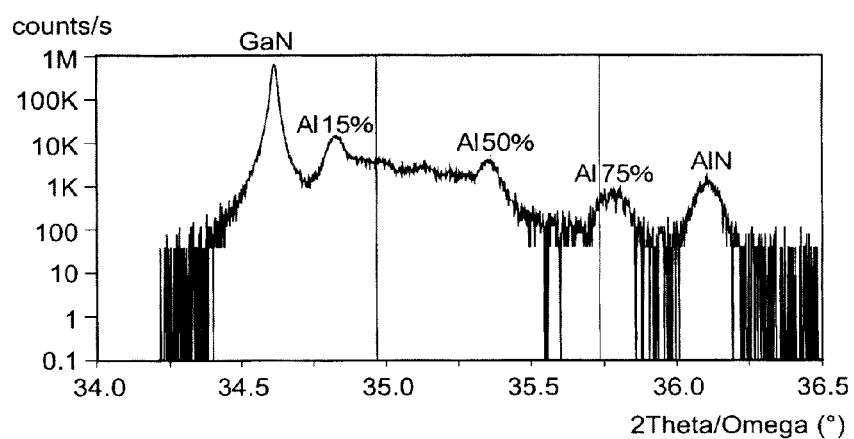

| | Ns(cm$^{-2}$) | Ne(cm$^{-2}$) | LO |
|---|---|---|---|
| 112 | $2.8 \times 10^8$ | $9.01 \times 10^8$ | 1 |
| ref1 | $3.1 \times 10^8$ | $2.11 \times 10^9$ | 0.75 |
| ref2 | $3.93 \times 10^8$ | $1.91 \times 10^9$ | × |

NITRIDE SEMICONDUCTOR WAFER, NITRIDE SEMICONDUCTOR ELEMENT, AND METHOD FOR MANUFACTURING NITRIDE SEMICONDUCTOR WAFER

CROSS-REFERENCE TO RELATED APPLICATIONS

This application is a divisional of U.S. application Ser. No. 14/805,141 filed Jul. 21, 2015, which is a divisional of U.S. application Ser. No. 14/175,199 filed Feb. 7, 2014, and is based upon and claims the benefit of priority from Japanese Patent Application No. 2013-120863, filed on Jun. 7, 2013; the entire contents of each of which are incorporated herein by reference.

FIELD

Embodiments described herein relate generally to a nitride semiconductor wafer and a nitride semiconductor element and a method for manufacturing nitride semiconductor wafer.

BACKGROUND

There is a nitride semiconductor wafer in which a semiconductor layer including a nitride semiconductor (hereinbelow, called a nitride semiconductor layer) is provided on a substrate including silicon. The nitride semiconductor wafer is used to manufacture, for example, a light emitting diode (LED), a high-speed electronic device, a power device, etc. Cracks occur easily in the nitride semiconductor layer of such a nitride semiconductor wafer due to the lattice constant difference and coefficient of thermal expansion difference between the nitride semiconductor layer and the substrate including silicon.

BRIEF DESCRIPTION OF THE DRAWINGS

FIGS. 3A to 3C are graphs and a table schematically showing examples of characteristics of the nitride semiconductor wafer according to the first embodiment;

DETAILED DESCRIPTION

Figure 1:
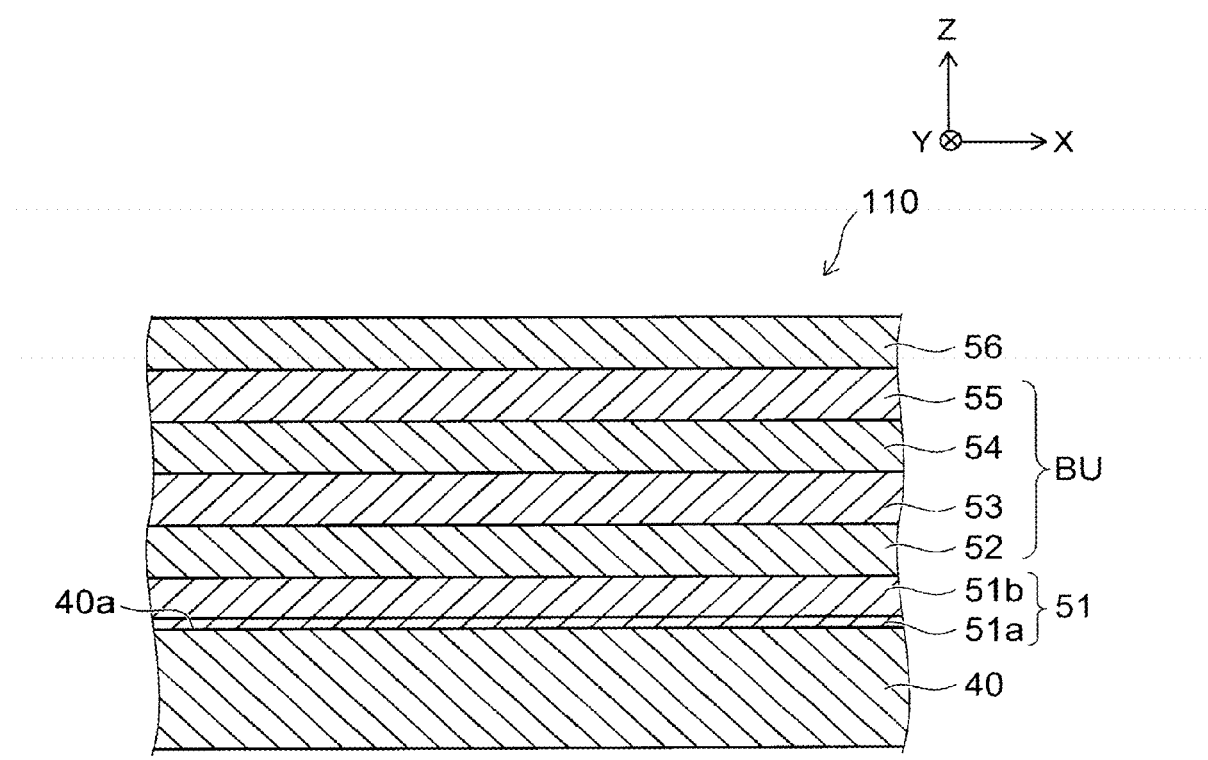
FIG. 1 is a cross-sectional view schematically showing the nitride semiconductor wafer according to the first embodiment.

According to one embodiment, a nitride semiconductor wafer includes a silicon substrate, a first layer, a second layer, a third layer, a fourth layer, a fifth layer, and a sixth layer. The first layer is of $Al_{x1}Ga_{1-x1}N$ ($0.8 \leq x1 \leq 1$) and is provided on the silicon substrate. The second layer is of $Al_{x2}Ga_{1-x2}N$ ($0.7 \leq x2 < 0.8$) and is provided on the first layer. The third layer is of $Al_{x3}Ga_{1-x3}N$ ($0.4 \leq x3 \leq 0.6$) and is provided on the second layer. The fourth layer is of $Al_{x4}Ga_{1-x4}N$ and is provided on the third layer. The fifth layer is of $Al_{x5}Ga_{1-x5}N$ ($0.1 \leq x5 \leq 0.2$) and is provided on the fourth layer. The sixth layer is of $Al_{x6}Ga_{1-x6}N$ ($0 \leq x6 < x5$) and is provided on the fifth layer. The composition ratio x4 of the fourth layer decreases in a first direction from the third layer toward the fifth layer. A maximum value of the composition ratio x4 is not more than the composition ratio x3 of the third layer. A minimum value of the composition ratio x4 is not less than the composition ratio x5 of the fifth layer.

According to another embodiment, a nitride semiconductor element includes a functional layer including a nitride semiconductor formed on a foundation layer. The foundation layer includes a first layer, a second layer, a third layer, a fourth layer, a fifth layer, and a sixth layer. The first layer is of $Al_{x1}Ga_{1-x1}N$ ($0.8 \leq x1 \leq 1$) and is formed on a silicon substrate. The second layer is of $Al_{x2}Ga_{1-x2}N$ ($0.7 \leq x2 < 0.8$) and is formed on the first layer. The third layer is of $Al_{x3}Ga_{1-x3}N$ ($0.4 \leq x3 \leq 0.6$) and is formed on the second layer. The fourth layer is of $Al_{x4}Ga_{1-x4}N$ and is formed on the third layer. The fifth layer is of $Al_{x5}Ga_{1-x5}N$ ($0.1 \leq x5 \leq 0.2$) and is formed on the fourth layer. The sixth layer is of $Al_{x6}Ga_{1-x6}N$ ($0 \leq x6 < x5$) and is formed on the fifth layer. The composition ratio x4 of the fourth layer decreases in a first direction from the third layer toward the fifth layer. A maximum value of the composition ratio x4 is not more than the composition ratio x3 of the third layer. A minimum value of the composition ratio x4 is not less than the composition ratio x5 of the fifth layer.

According to another embodiment, a method is disclosed for manufacturing a nitride semiconductor wafer. The method can include forming a first layer of $Al_{x1}Ga_{1-x1}N$ ($0.8 \leq x1 \leq 1$) on a silicon substrate. The method can include forming a second layer of $Al_{x2}Ga_{1-x2}N$ ($0.7 \leq x2 < 0.8$) on the first layer. The method can include forming a third layer of $Al_{x3}Ga_{1-x3}N$ ($0.4 \leq x3 \leq 0.6$) on the second layer. The method can include forming a fourth layer of $Al_{x4}Ga_{1-x4}N$ on the third layer. The method can include forming a fifth layer of $Al_{x5}Ga_{1-x5}N$ ($0.1 \leq x5 \leq 0.2$) on the fourth layer. The method can include forming a sixth layer of $Al_{x6}Ga_{1-x6}N$ ($0 \leq x6 < x5$) on the fifth layer. The forming of the fourth layer includes causing the composition ratio x4 of the fourth layer to decrease in a first direction from the third layer toward the fifth layer, setting a maximum value of the composition ratio x4 to be not more than the composition ratio x3 of the third layer, and setting a minimum value of the composition ratio x4 to be not less than the composition ratio x5 of the fifth layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

A nitride semiconductor wafer 110 according to the embodiment is used to manufacture a nitride semiconductor element such as, for example, a semiconductor light emitting element, a semiconductor light receiving element, an electronic device, etc. The semiconductor light emitting element includes, for example, a light emitting diode (LED), a laser diode (LD), etc. The semiconductor light receiving element includes, for example, a photodiode (PD), etc. The electronic device includes, for example, a high electron mobility transistor (HEMT), a heterojunction bipolar transistor (HBT), a field effect transistor (FET), a Schottky barrier diode (SBD), etc.

FIG. 1 is a cross-sectional view schematically showing the nitride semiconductor wafer according to the first embodiment.

As shown in FIG. 1, the nitride semiconductor wafer 110 includes a substrate 40, a first layer 51, a second layer 52, a third layer 53, a fourth layer 54, a fifth layer 55, and a sixth layer 56.

The substrate 40 includes silicon. The substrate 40 is, for example, a silicon substrate.

The first layer 51 is provided on the substrate 40. The first layer 51 is provided on, for example, an upper surface 40a of the substrate 40. The second layer 52 is provided on the first layer 51. The third layer 53 is provided on the second layer 52. The fourth layer 54 is provided on the third layer 53. The fifth layer 55 is provided on the fourth layer 54. The sixth layer 56 is provided on the fifth layer 55.

The first layer 51 contacts, for example, the substrate 40. The second layer 52 contacts, for example, the first layer 51. The third layer 53 contacts, for example, the second layer 52. The fourth layer 54 contacts, for example, the third layer 53. The fifth layer 55 contacts, for example, the fourth layer 54. The sixth layer 56 contacts, for example, the fifth layer 55.

Herein, a direction from the substrate 40 toward the sixth layer 56 is taken as a Z-axis direction. One direction perpendicular to the Z-axis direction is taken as an X-axis direction. A direction perpendicular to the Z-axis direction and the X-axis direction is taken as a Y-axis direction. The Z-axis direction is, for example, a direction perpendicular to the upper surface 40a of the substrate 40.

The first layer 51 includes $Al_{x1}Ga_{1-x1}N$. The second layer 52 includes $Al_{x2}Ga_{1-x2}N$. The third layer 53 includes $Al_{x3}Ga_{1-x3}N$. The fourth layer 54 includes $Al_{x4}Ga_{1-x4}N$. The fifth layer 55 includes $Al_{x5}Ga_{1-x5}N$. The sixth layer 56 includes $Al_{x6}Ga_{1-x6}N$. In other words, the first to sixth layers 51 to 56 are nitride semiconductor layers including nitride semiconductors.

The first layer 51 is, for example, an AlN layer. The second layer 52 to the fifth layer 55 are, for example, AlGaN layers. The sixth layer 56 is, for example, a GaN layer. The Al composition ratio x3 of the third layer 53 is lower than the Al composition ratio x2 of the second layer 52. The Al composition ratio x5 of the fifth layer 55 is lower than the Al composition ratio x3 of the third layer 53. The Al composition ratio x4 of the fourth layer 54 decreases, for example, from the Al composition ratio x3 of the third layer 53 to the Al composition ratio x5 of the fifth layer 55.

Herein, the second to fifth layers 52 to 55 are collectively called a buffer unit BU. The buffer unit BU includes, for example, AlGaN. The buffer unit BU is provided between the first layer 51 and the sixth layer 56. In other words, the buffer unit BU is provided on the first layer 51; and the sixth layer 56 is provided on the buffer unit BU. The buffer unit BU includes at least the second to fifth layers 52 to 55. The buffer unit BU may further include other layers.

Figure 2:
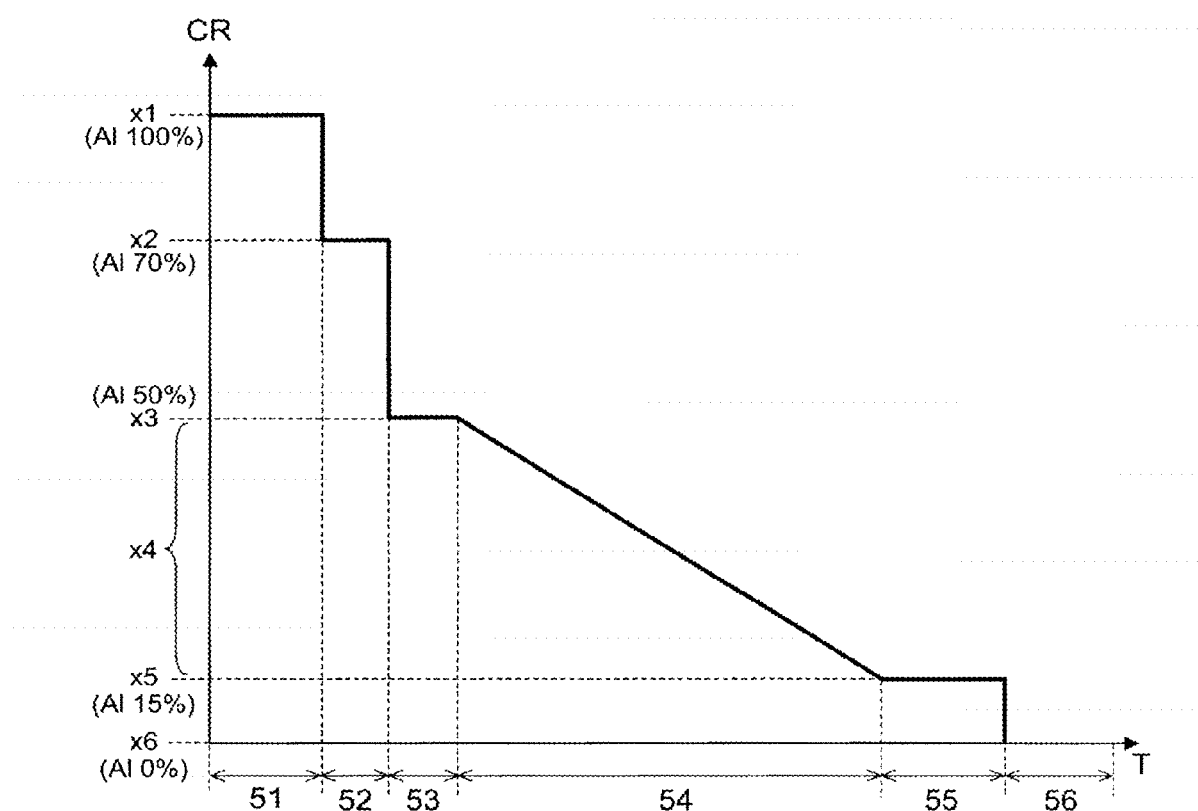
FIG. 2 is a graph schematically showing an example of a characteristic of the nitride semiconductor wafer according to the first embodiment.

FIG. 2 is a graph schematically showing an example of a characteristic of the nitride semiconductor wafer according to the first embodiment.

FIG. 2 schematically shows the Al composition ratios of the first to sixth layers 51 to 56. In FIG. 2, the vertical axis is an Al composition ratio CR for the first to sixth layers 51 to 56; and the horizontal axis is a position T of the first to sixth layers 51 to 56 in the Z-axis direction (the thickness direction).

In the example as shown in FIG. 2, the Al composition ratio x1 of the first layer 51 is 1. The Al composition ratio x2 of the second layer 52 is 0.7. The Al composition ratio x3 of the third layer 53 is 0.5. The Al composition ratio x5 of the fifth layer 55 is 0.15. The Al composition ratio x6 of the sixth layer 56 is 0.

The composition ratio x1 is, for example, $0.8 \leq x1 \leq 1$.
The composition ratio x2 is, for example, $0.7 \leq x2 < 0.8$.
The composition ratio x3 is, for example, $0.4 \leq x3 \leq 0.6$.
The composition ratio x5 is, for example, $0.1 \leq x5 \leq 0.2$.
The composition ratio x6 is, for example, $0 \leq x6 < x5$.

The Al composition ratio x4 of the fourth layer 54 decreases in the first direction from the third layer 53 toward the fifth layer 55. For example, the composition ratio x4 decreases continuously in the first direction. The first direction is a direction parallel to the Z-axis direction. In other words, the first direction is a direction perpendicular to the upper surface 40a of the substrate 40. The first direction is, for example, perpendicular to the film surfaces of the first to sixth layers 51 to 56. The maximum value of the composition ratio x4 is not more than the Al composition ratio x3 of the third layer 53. The minimum value of the composition ratio x4 is not less than the Al composition ratio x5 of the fifth layer 55. In the example, the maximum value of the composition ratio x4 is substantially the same as the composition ratio x3; and the minimum value of the composition ratio x4 is substantially the same as the composition ratio x5. For example, the composition ratio x4 changes continuously between the composition ratio x3 and the composition ratio x5.

FIGS. 3A to 3C are graphs and a table schematically showing examples of characteristics of the nitride semiconductor wafer according to the first embodiment.

FIG. 3A is a reciprocal lattice space map showing an example of a characteristic of the nitride semiconductor wafer 110.

FIG. 3B is a table showing a relaxation rate SR and lattice mismatch LM (%) for the first to sixth layers 51 to 56 determined from the reciprocal lattice space map. FIG. 3B shows the relaxation rate SR and the lattice mismatch LM between each layer and the layer directly under each layer for the second to sixth layers 52 to 56.

FIG. 3C is a graph showing an example of the measurement results of X-ray diffraction (XRD) used to make the reciprocal lattice space map.

In FIG. 3A, the horizontal axis is a reciprocal Qx of the lattice constant in the <11-20> direction; and the vertical axis is a reciprocal Qz of the lattice constant in the <0004> direction.

In the nitride semiconductor wafer 110 as shown in FIG. 3A, the difference between the lattice constants in the a-axis direction of the first layer 51 (the AlN layer) and the sixth layer 56 (the GaN layer) is changed in stages for the AlGaN layers of the second to fifth layers 52 to 55.

Thereby, in the nitride semiconductor wafer 110, for example, compressive stress can be applied to the sixth layer 56 while suppressing lattice relaxation of the first to sixth layers 51 to 56. Thereby, in the nitride semiconductor wafer 110, for example, the warp of the substrate 40 when returning to room temperature from the manufacturing temperature can be suppressed; and cracks of the first to sixth layers 51 to 56, etc., can be suppressed.

Figure 4:
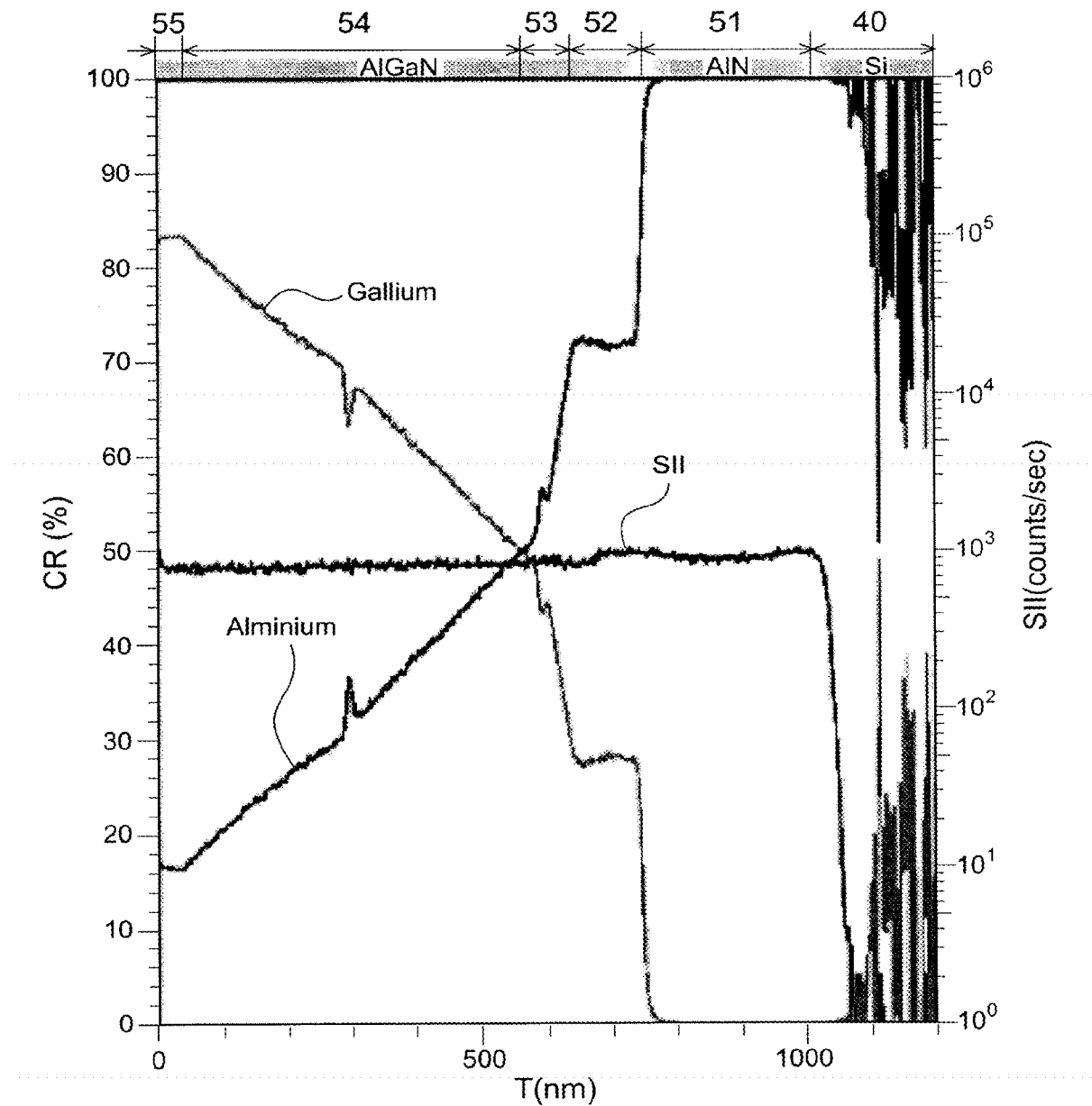
FIG. 4 is a graph schematically showing an example of characteristics of the nitride semiconductor wafer according to the first embodiment.

FIG. 4 is a graph schematically showing an example of characteristics of the nitride semiconductor wafer according to the first embodiment.

FIG. 4 shows an example of the analysis results of the nitride semiconductor wafer 110 by SIMS (Secondary Ion Mass Spectrometry).

The vertical axis on the left side in FIG. 4 is the composition ratio CR (%) for Al and Ga of the nitride semiconductor wafer 110. The vertical axis on the right side in FIG. 4 is the secondary ion intensity SII (counts/sec) of the nitride semiconductor wafer 110. The horizontal axis in FIG. 4 is the Z-axis direction position T (nm) of the nitride semiconductor wafer 110.

As shown in FIG. 4, the Al composition ratio, the Ga composition ratio, and the secondary ion intensity of the nitride semiconductor wafer 110 can be analyzed by, for example, SIMS.

In FIG. 2, each of the composition ratios x1 to x6 illustrated schematically by a straight line. Actually, as shown in FIG. 4, each of the composition ratios x1 to x6 fluctuates slightly due to the manufacturing fluctuation, the measurement error, etc. For example, the maximum value of the composition ratio x4 is not more than the maximum value of the composition ratio x3. The minimum value of the composition ratio x4 is not less than the maximum value of the composition ratio x5.

Figure 5:
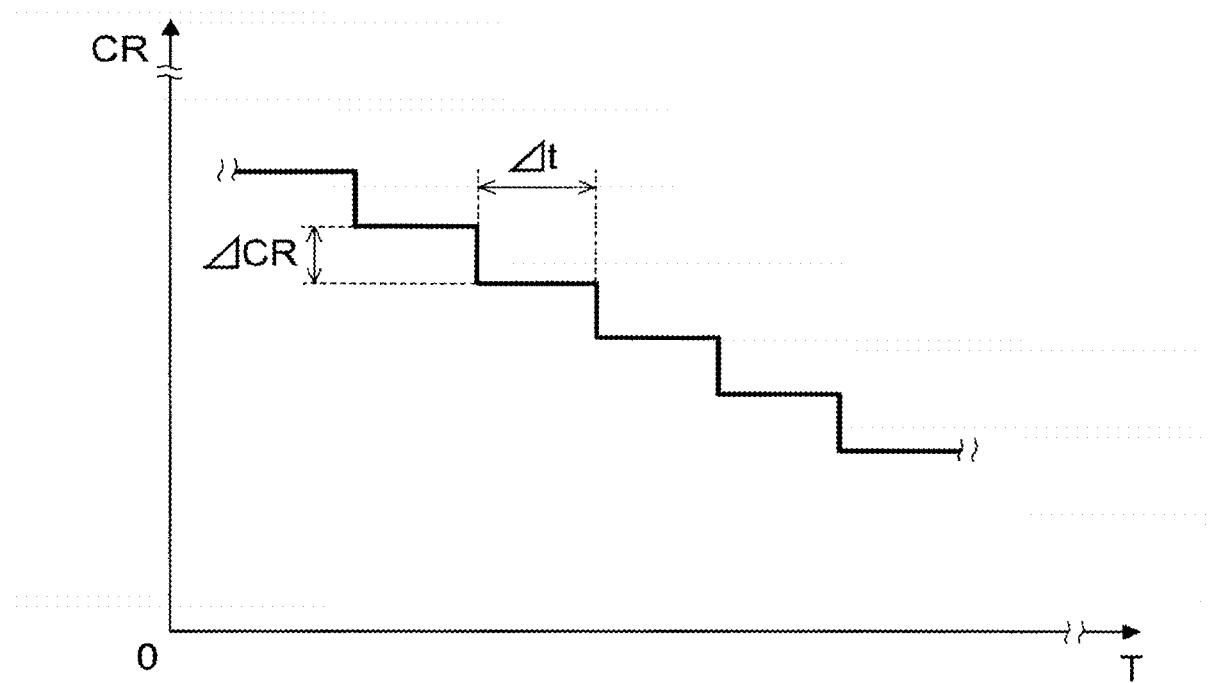
FIG. 5 is a graph schematically showing an example of a characteristic of the nitride semiconductor wafer according to the first embodiment.

FIG. 5 is a graph schematically showing an example of a characteristic of the nitride semiconductor wafer according to the first embodiment.

FIG. 5 is a graph showing an enlargement of a portion of the fourth layer 54 of the graph of FIG. 2.

When manufacturing the fourth layer 54 as shown in FIG. 5, it may be considered to form the composition ratio x4 to decrease substantially continuously by changing the Al composition ratio in stages having extremely fine steps. For example, it may be considered to form the composition ratio x4 by reducing the flow rate of the Al source-material gas supplied to the reaction chamber of a MOCVD apparatus, etc., in stages having extremely fine steps.

When changing the composition ratio x4 in fine steps, the thickness of one step is $\Delta t$. The difference between the Al composition ratios of adjacent steps is $\Delta CR$. The critical film thickness of one step is determined from $\Delta CR$. In the specification of the application, the composition ratio x4 "decreasing continuously" also includes the case where, for example, $\Delta t$ is smaller than the critical film thickness of one step ($\Delta t$<critical film thickness). Thus, the composition ratio x4 may be changed in stages having fine steps.

The substrate 40 includes, for example, a Si (111) substrate. However, the plane orientation of the substrate 40 may not be the (111) plane. The substrate 40 includes, for example, an on-axis substrate that substantially does not have an off-angle. The off-angle of the substrate 40 is, for example, <111>±0.1°.

The inventors of the application compared the warp of the wafer for the case where a GaN layer is grown on the substrate 40 having an off-angle within <111>±0.1° and for the case where the GaN layer is grown on the substrate 40 having an off-angle within <111>±1°. As a result, the wafer is in an upwardly-warped state in the case where the substrate 40 that is within ±0.1 degrees is used. In other words, the wafer is in a state of being warped such that the sixth layer 56 side is a protrusion. In other words, the wafer is in a state in which compressive stress is applied to the GaN layer. On the other hand, the wafer is in a downwardly-warped state in the case where the substrate 40 that is within ±1 degrees is used. In other words, the wafer is in a state of being warped such that the substrate 40 side is a protrusion. In other words, the wafer is in a state in which the compressive stress applied to the GaN layer is weak. Thus, the off-angle of the substrate 40 is set to be within <111>±0.1°. Thereby, it is easy to apply compressive stress to the GaN layer.

The first layer 51 includes, for example, a first AlN layer 51a and a second AlN layer 51b. For example, the first AlN layer 51a is provided on the upper surface 40a of the silicon (111) plane of the substrate 40. The second AlN layer 51b is provided on the first AlN layer 51a. Thus, the first layer 51 may have a stacked structure including multiple layers.

The first AlN layer 51a and the second AlN layer 51b include, for example, carbon. For example, the carbon concentration of the first AlN layer 51a is higher than the carbon concentration of the second AlN layer 51b. In other words, the AlN purity of the second AlN layer 51b is higher than the AlN purity of the first AlN layer 51a. The carbon concentration of the first AlN layer 51a is, for example, $1 \times 10^{19}$ cm$^{-3}$ to $5 \times 10^{20}$ cm$^{-3}$. The thickness (the length in the Z-axis direction) of the first AlN layer 51a is, for example, 3 nm to 20 nm. The carbon concentration of the second AlN layer 51b is, for example, $1\times10^{16}$ cm$^{-3}$ to $1\times10^{19}$ cm$^{-3}$. The thickness of the second AlN layer 51b is, for example, 200 nm. The thickness of the first layer 51 (the sum of the thickness of the first AlN layer 51a and the thickness of the second AlN layer 51b) is, for example, not less than 150 nm and not more than 250 nm.

The first AlN layer 51a that has the high carbon concentration relaxes, for example, the difference between the crystal types of the substrate 40 and the layers. For example, screw dislocations are reduced. For example, the high-purity second AlN layer 51b causes the upper surface of the first layer 51 (the upper surface of the second AlN layer 51b) to be flat at the atomic level. The thickness of the second AlN layer 51b is set to be 150 nm or more. Thereby, for example, the upper surface of the first layer 51 can be appropriately caused to be flat.

The growth temperature of the first AlN layer 51a is, for example, 1080° C. The growth temperature of the second AlN layer 51b is, for example, 1280° C. Thus, the first layer 51 includes $Al_{x1}Ga_{1-x1}N$ that is grown at a high temperature. The growth temperature of the $Al_{x1}Ga_{1-x1}N$ of the first layer 51 is, for example, not less than 1000° C. and not more than 1300° C. For example, in the case where the $Al_{x1}Ga_{1-x1}N$ is grown at a temperature less than 1000° C., the AlN does not grow well two-dimensionally; and the flatness degrades. Also, the crystal has many defects. The growth temperature of the $Al_{x1}Ga_{1-x1}N$ is set to be, for example, not less than 1200° C. and not more than 1300° C. Thereby, for example, high-quality monocrystalline AlN can be formed.

Figure 6A:
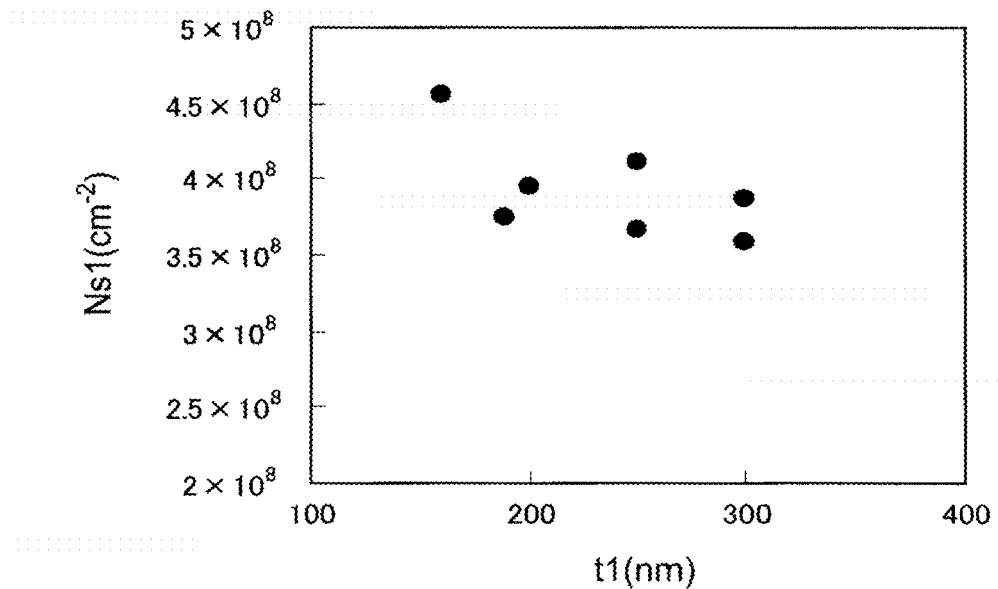
FIGS. 6A and 6B are graphs showing examples of characteristics of the nitride semiconductor wafer according to the first embodiment.
Figure 6B:
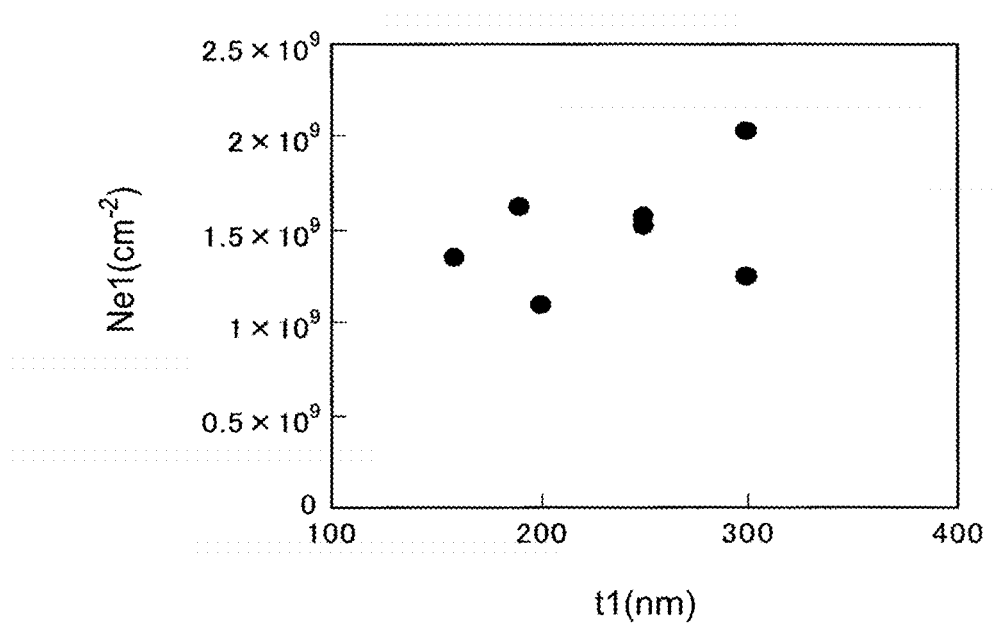

FIGS. 6A and 6B are graphs showing examples of characteristics of the nitride semiconductor wafer according to the first embodiment.

FIG. 6A shows the relationship between the thickness and the dislocation density of the screw dislocation component determined from the X-ray diffraction for the first layer 51. The vertical axis of FIG. 6A is a screw dislocation density Ns1 (cm$^{-2}$) of the first layer 51; and the horizontal axis of FIG. 6A is a thickness t1 (nm) of the first layer 51.

FIG. 6B shows the relationship between the thickness and the dislocation density of the edge dislocation component determined from the X-ray diffraction for the first layer 51. The vertical axis of FIG. 6B is an edge dislocation density Ne1 (cm$^{-2}$) of the first layer 51; and the horizontal axis of FIG. 6B is the thickness t1 (nm) of the first layer 51.

As shown in FIG. 6A, the dislocation density Ns1 of the screw dislocation component of the first layer 51 tends to decrease as the thickness t1 of the first layer 51 increases. On the other hand, as shown in FIG. 6B, although the dislocation density Ne1 of the edge dislocation component of the first layer fluctuates, the dislocation density Ne1 of the edge dislocation component of the first layer 51 tends to decrease as the thickness t1 of the first layer 51 decreases. When the thickness of the first layer 51 becomes 250 nm or more, pits (holes) occur in the upper surface; and cracks occur. Accordingly, it is desirable for the thickness t1 of the first layer 51 to be 250 nm or less. In other words, it is desirable for the thickness t1 to be not less than 150 nm and not more than 250 nm.

The first layer 51 may include, for example, gallium in the range of $Al_{x1}Ga_{1-x1}N$ ($0.8 \le x1 \le 1$). However, AlN does not chemically react easily with the substrate 40 that includes silicon. Therefore, the first layer 51 includes an AlN layer. Thereby, for example, problems such as meltback etching, etc., can be solved easily.

For example, coherent growth of the second layer 52 is performed on the first layer 51. That is, the lattice constants in the direction parallel to the upper surface 40a of the substrate 40 (the lattice constants in the a-axis direction) substantially match each other. The lattice constant of the second layer 52 in the a-axis direction is substantially the same as the lattice constant of the first layer 51 in the a-axis direction. This indicates a state in which a large compressive stress is applied to the second layer 52. The lattice mismatch between the a-axis directions of the first layer 51 (the AlN layer) and the second layer 52 (the AlGaN layer (x2=0.7)) is, for example, 9%. The Al composition ratio x2 of the second layer 52 and the thickness of the second layer 52 are set to be values at which good flatness of the upper surface of the second layer 52 can be realized without lattice relaxation of the second layer 52.

The Al composition ratio x2 of the second layer 52 is, for example, not less than 0.7 but less than 0.8. For example, the flatness of the third layer 53 degrades when the difference between the composition ratio x2 of the second layer 52 and the composition ratio x3 of the third layer 53 becomes large. Also, in the case where another AlGaN layer that includes a medium Al composition ratio is further provided between the second layer 52 and the third layer 53, the thickness of the entire buffer unit BU increases; and, for example, cracks undesirably occur more easily. Therefore, when the composition ratio x2 is too high, for example, it becomes undesirably difficult to form a GaN layer (the sixth layer 56) that is thin, flat, and subjected to compressive stress.

Moreover, in the case where the composition ratio x2 is low, the difference between the composition ratio x2 and the composition ratio x1 of the first layer 51 undesirably becomes large. Thereby, for example, lattice relaxation of the second layer 52 undesirably occurs easily. For example, the flatness of the upper surface of the second layer 52 undesirably degrades. Accordingly, the composition ratio x2 is set to be not less than 0.7 but less than 0.8. Thereby, for example, the lattice relaxation of the second layer 52 can be suppressed. For example, the decrease of the flatness of the upper surface of the second layer 52 can be suppressed.

Figure 7A:
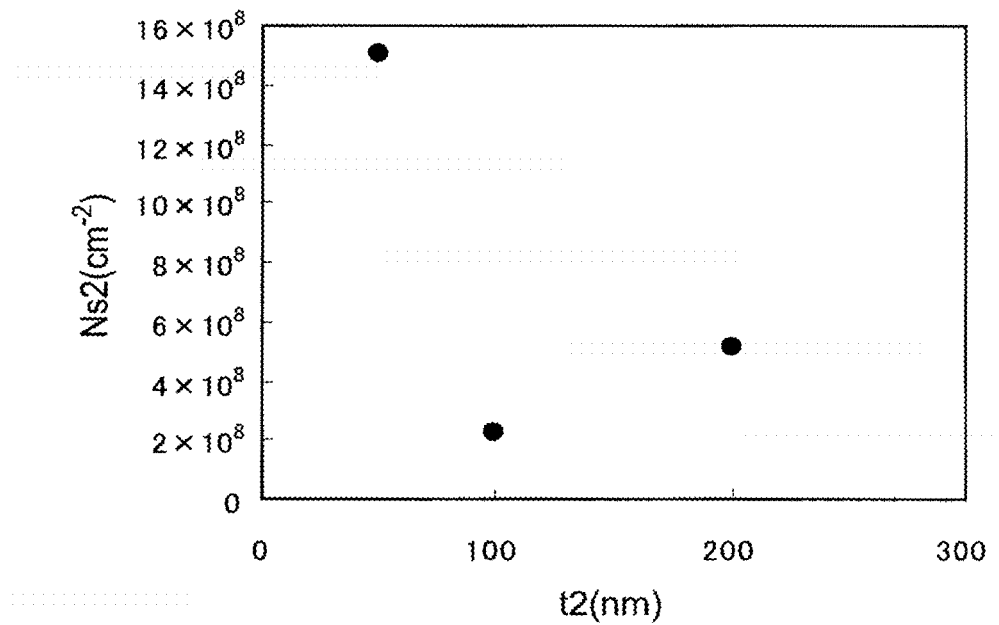
FIGS. 7A and 7B are graphs showing examples of characteristics of the nitride semiconductor wafer according to the first embodiment.
Figure 7B:
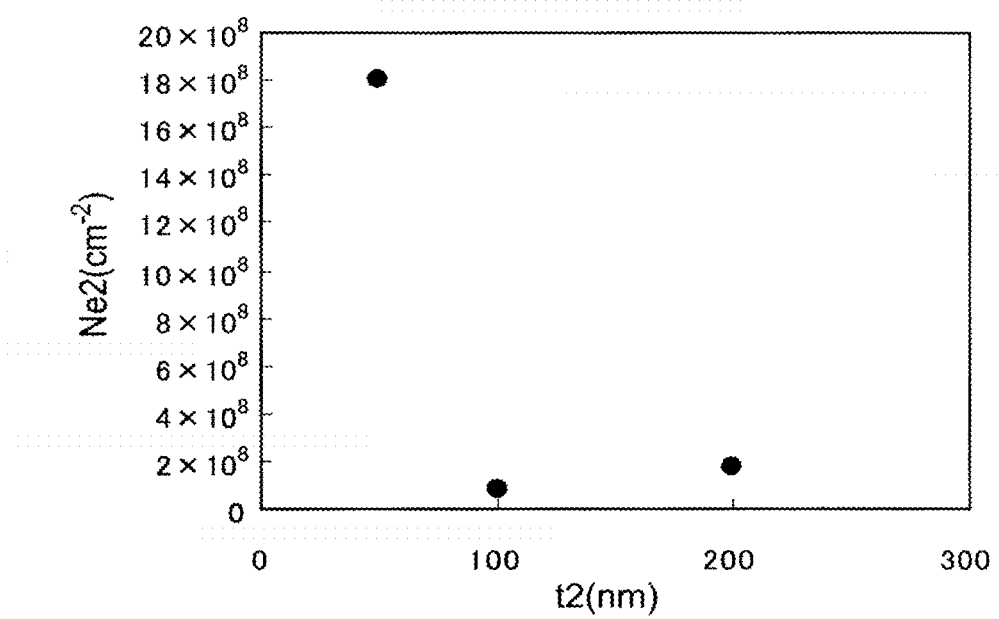

FIGS. 7A and 7B are graphs showing examples of characteristics of the nitride semiconductor wafer according to the first embodiment.

FIG. 7A shows the relationship between the thickness and the dislocation density of the screw dislocation component determined from the X-ray diffraction for the second layer 52. The vertical axis of FIG. 7A is a screw dislocation density Ns2 (cm$^{-2}$) of the second layer 52; and the horizontal axis of FIG. 7A is a thickness t2 (nm) of the second layer 52.

FIG. 7B shows the relationship between the thickness and the dislocation density of the edge dislocation component determined from the X-ray diffraction for the second layer 52. The vertical axis of FIG. 7B is an edge dislocation density Ne2 (cm$^{-2}$) of the second layer 52; and the horizontal axis of FIG. 7B is the thickness t2 (nm) of the second layer 52.

As shown in FIGS. 7A and 7B, when the thickness t2 of the second layer 52 is set to be 100 nm, both the screw dislocation density Ns2 and the edge dislocation density Ne2 reach their lowest values. When the thickness t2 exceeds 200 nm, cracks occurs easily in the second layer 52. Moreover, lattice relaxation of the second layer 52 occurs easily. Accordingly, the thickness t2 of the second layer 52 is set to be, for example, 100 nm (not less than 80 nm and not more than 200 nm). Thereby, for example, the cracks of the second layer 52 can be suppressed. For example, the lattice relaxation of the second layer 52 can be suppressed.

The Al composition ratio x3 of the third layer 53 and the thickness of the third layer 53 are set to be values at which good flatness of the upper surface of the third layer 53 can be realized while avoiding lattice relaxation of the third layer 53 as much as possible. The Al composition ratio x3 of the third layer 53 is, for example, 0.5 (e.g., not less than 0.4 and not more than 0.6). The thickness of the third layer 53 is, for example, 100 nm (e.g., not less than 80 nm and not more than 200 nm).

When the composition ratio x3 is too high, for example, the change amount of the Al composition ratio x4 of the fourth layer 54 becomes large. In such a case, high-quality crystal growth of the fourth layer 54 becomes difficult. Specifically, it becomes difficult to set the growth temperature and/or the gas supply amount. The growth temperature and/or the gas supply amount that is suited to the crystal growth is different according to the Al composition ratio. Therefore, in the case where the change amount of the composition ratio x4 is large, for example, the growth temperature and/or the gas supply amount undesirably departs from the optimal value partway. Thereby, for example, an unevenness (a three-dimensional growth mode) undesirably occurs in the growth surface. The unevenness of the growth surface causes, for example, lattice defects, lattice relaxation, etc.

On the other hand, when the composition ratio x3 is too low, for example, the difference between the composition ratio x3 and the composition ratio x2 of the second layer 52 becomes large. Thereby, for example, an unevenness is formed (three-dimensional growth occurs) at the vicinity of the interface between the third layer 53 and the second layer 52 in the crystal growth of the third layer 53 which may cause lattice defects and/or lattice relaxation.

The thickness of the third layer 53 is set to be 80 nm or more. Thereby, for example, good flatness of the upper surface of the third layer 53 can be obtained. Further, the thickness of the third layer 53 is set to be greater than 300 nm. In such a case, for example, cracks occurs easily in the third layer 53; and lattice relaxation of the third layer 53 occurs easily.

Accordingly, the thickness of the third layer 53 is set to be not less than 80 nm and not more than 200 nm. Thereby, for example, the lattice relaxation of the third layer 53 can be suppressed. For example, the flatness of the upper surface of the third layer 53 can be improved. For example, pits did not exist and the surface roughness Ra was 1.4 nm for the upper surface of the third layer 53 having a thickness of 250 nm when observed by an optical microscope and AFM.

The fourth layer 54 is provided between the third layer 53 and the fifth layer 55. For example, the Al composition ratio x4 of the fourth layer 54 decreases continuously from the composition ratio x3 to the composition ratio x5 from the third layer 53 toward the fifth layer 55. For example, the fourth layer 54 suppresses the abrupt change of the Al composition ratio between the third layer 53 and the fifth layer 55. Thereby, for example, the lattice relaxation of the fourth layer 54 and/or the fifth layer 55 can be suppressed.

The thickness of the fourth layer 54 is, for example, 600 nm (e.g., not less than 500 nm and not more than 700 nm). For example, the Al composition ratio x4 of the fourth layer 54 decreases continuously from 0.5 to 0.15. The composition ratio x4 is determined by, for example, the composition ratio x3 and the composition ratio x5. The maximum value of the composition ratio x4 may be lower than the composition ratio x3. In other words, the Al composition ratio of the fourth layer 54 at the vicinity of the interface between the fourth layer 54 and the third layer 53 may be lower than the composition ratio x3. It is favorable for the difference (x3−x4) between the maximum value of the composition ratio x4 and the composition ratio x3 to be, for example, 0.1 or less. The minimum value of the composition ratio x4 may be higher than the composition ratio x5. In other words, the Al composition ratio of the fourth layer 54 at the vicinity of the interface between the fourth layer 54 and the fifth layer 55 may be higher than the composition ratio x5. It is favorable for the difference (x4−x5) between the minimum value of the composition ratio x4 and the composition ratio x5 to be, for example, 0.1 or less.

The Al composition ratio x5 of the fifth layer 55 is, for example, 0.15 (e.g., not less than 0.1 and not more than 0.2). When the composition ratio x5 is too high, for example, an unevenness occurs easily in the sixth layer 56 (the GaN layer) provided on the fifth layer 55. In other words, three-dimensional growth occurs easily and may cause, for example, lattice defects and/or lattice relaxation of the sixth layer 56. For example, the composition ratio x5 is set to be a value that avoids lattice relaxation of the sixth layer 56 as much as possible. For example, the composition ratio x5 is set to be a value that avoids lattice relaxation of the GaN layer as much as possible.

Figure 8A:
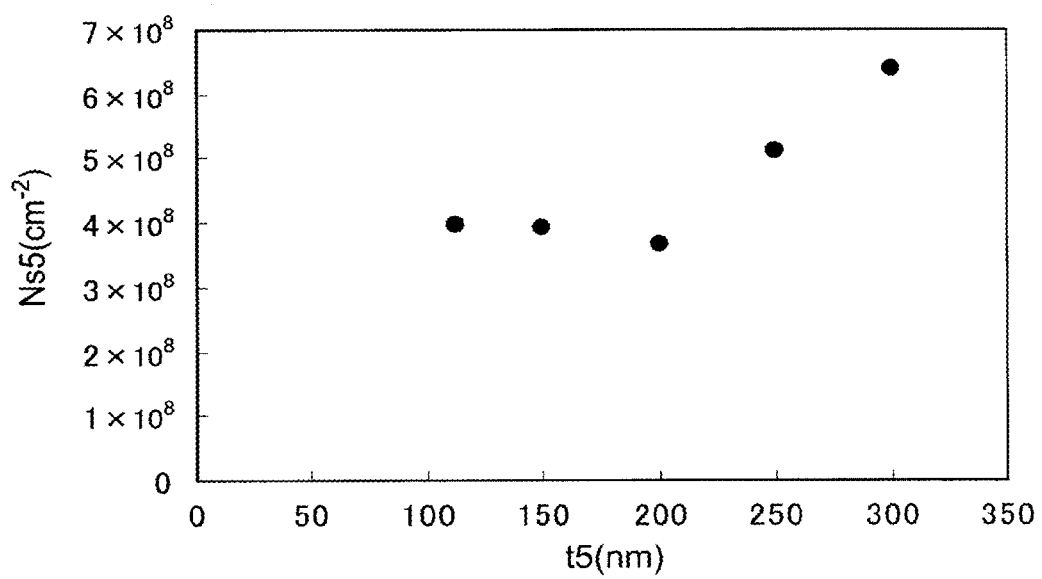
FIGS. 8A and 8B are graphs showing examples of characteristics of the nitride semiconductor wafer according to the first embodiment.
Figure 8B:
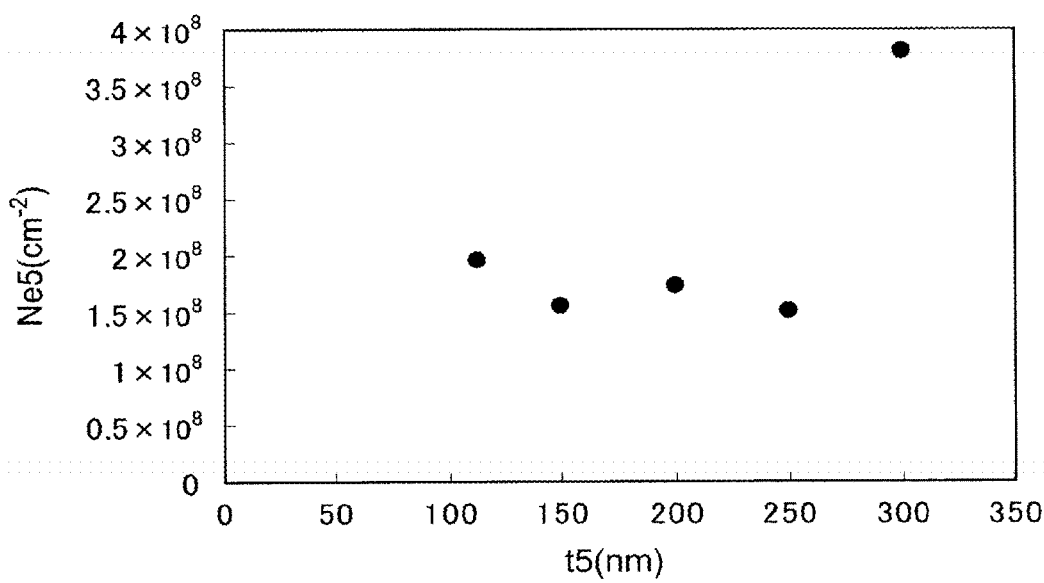

FIGS. 8A and 8B are graphs showing examples of characteristics of the nitride semiconductor wafer according to the first embodiment.

FIG. 8A shows the relationship between the thickness and the dislocation density of the screw dislocation component determined from the X-ray diffraction for the fifth layer 55. The vertical axis of FIG. 8A is a screw dislocation density Ns5 (cm$^{-2}$) of the fifth layer 55; and the horizontal axis of FIG. 8A is a thickness t5 (nm) of the fifth layer 55.

FIG. 8B shows the relationship between the thickness and the dislocation density of the edge dislocation component determined from the X-ray diffraction for the fifth layer 55. The vertical axis of FIG. 8B is an edge dislocation density Ne5 (cm$^{-2}$) of the fifth layer 55; and the horizontal axis of FIG. 8B is the thickness t5 (nm) of the fifth layer 55.

As shown in FIG. 8A, the screw dislocation density Ns5 of the fifth layer 55 becomes low in the range of 100 nm to 200 nm. As shown in FIG. 8B, the edge dislocation density Ne5 of the fifth layer 55 becomes low in the range of 100 nm to 250 nm. Further, when the thickness t5 is set to be 100 nm, the unevenness of the upper surface of the fifth layer 55 tends to become large. When the thickness t5 is set to be 150 nm or more, the flatness of the upper surface of the fifth layer 55 improves. For example, the surface roughness Ra can be 6 nm or less. Accordingly, the thickness t5 is set to be, for example, 150 nm (e.g., not less than 100 nm and not more than 250 nm). Thereby, for example, good flatness of the upper surface and a low dislocation density can be obtained for the fifth layer 55.

Figure 9A:
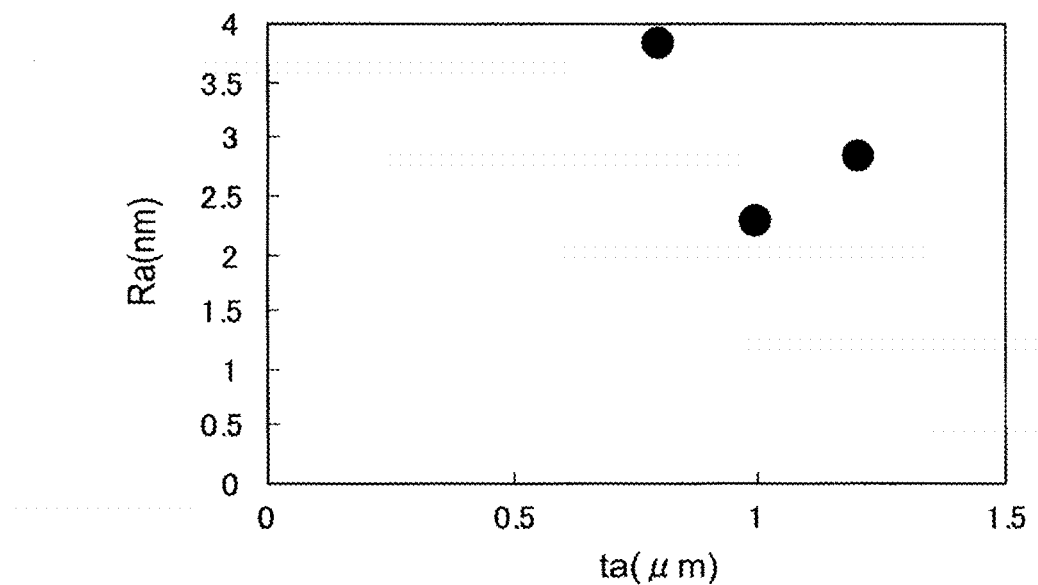
FIGS. 9A and 9B are graphs showing examples of characteristics of the nitride semiconductor wafer according to the first embodiment.
Figure 9B:
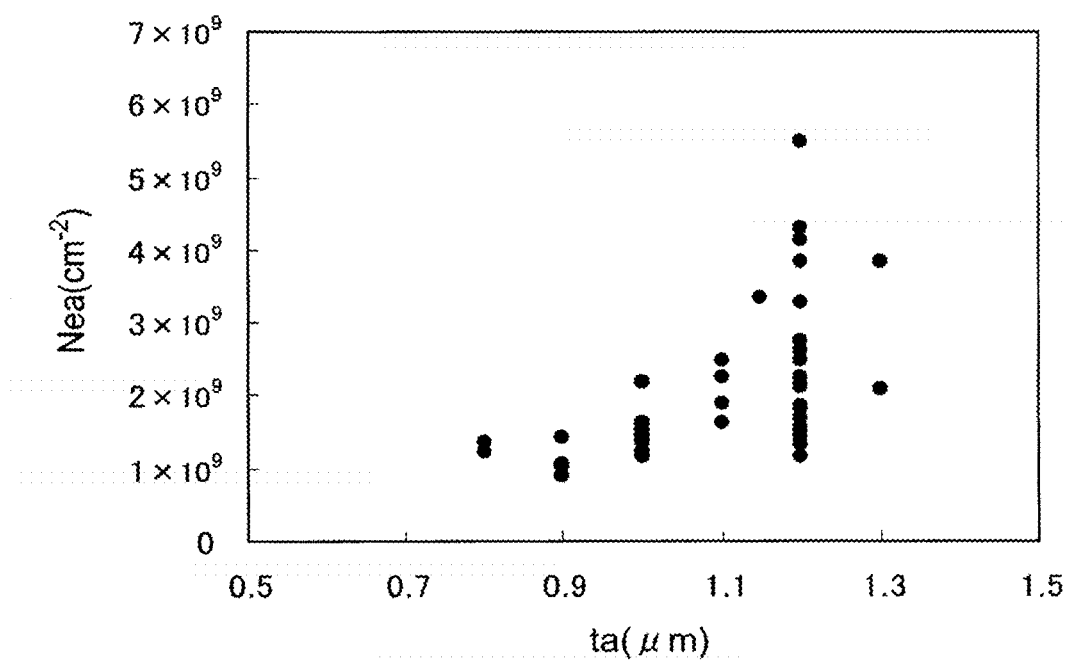

FIGS. 9A and 9B are graphs showing examples of characteristics of the nitride semiconductor wafer according to the first embodiment.

FIG. 9A shows the relationship between the thickness of the buffer unit BU and the surface roughness of the upper surface of the buffer unit BU. In the example, the upper surface of the buffer unit BU is namely the upper surface of the fifth layer 55. The thickness of the buffer unit BU is the sum of the thickness of the second layer 52, the thickness of the third layer 53, the thickness of the fourth layer 54, and the thickness of the fifth layer 55. The vertical axis of FIG. 9A is the surface roughness Ra (nm) of the upper surface of the buffer unit BU; and the horizontal axis of FIG. 9A is the thickness ta (μm) of the buffer unit BU.

FIG. 9B shows the relationship between the thickness of the buffer unit BU and the dislocation density of the edge dislocation component determined from the X-ray diffraction of the buffer unit BU. The vertical axis of FIG. 9B is an edge dislocation density Nea ($cm^{-2}$) of the buffer unit BU; and the horizontal axis of FIG. 9B is the thickness ta (nm) of the buffer unit BU.

As shown in FIGS. 9A and 9B, in the case where the buffer unit BU is made such that the thickness ta is thin, the edge dislocation density Nea decreases; but on the other hand, the flatness of the upper surface of the buffer unit BU degrades. For example, the upper surface of the buffer unit BU is slightly rough in the case where the thickness ta is set to be 0.8 µm. Then, when the thickness ta is reduced further, for example, many pits occur in the upper surface; and a flat layer is not obtained.

When the thickness ta exceeds 1.5 for example, cracks in the buffer unit BU increase. In the case where the thickness ta is set to be too thick, for example, lattice relaxation inside the buffer unit BU occurs. Thereby, for example, the compressive stress is not transmitted easily to the sixth layer 56. For example, tensile stress is applied to the sixth layer 56; and cracks occur in the buffer unit BU and/or the sixth layer 56.

Accordingly, the thickness ta of the buffer unit BU is set to be, for example, 1 µm (not less than 0.8 µm and not more than 1.2 µm). Thereby, for example, cracks of the buffer unit BU are suppressed; and good flatness of the upper surface of the buffer unit BU can be obtained.

In the case where multiple AlGaN layers having different Al composition ratios are stacked, an unevenness occurs easily in the growth surface for each of the AlGaN layers. In other words, the growth surfaces easily have a three-dimensional growth mode. Thereby, for example, lattice defects occur easily in the AlGaN layers.

Conversely, in the nitride semiconductor wafer 110 according to the embodiment, for example, good flatness of the upper surface can be obtained for each of the first to sixth layers 51 to 56. For example, the surface roughness Ra of the upper surface can be 6 nm or less for each of the first to sixth layers 51 to 56.

Also, in the nitride semiconductor wafer 110, the lattice relaxation can be suppressed for the first to sixth layers 51 to 56. For example, the growth can be performed while applying compressive stress for the first layer 51 that has the high Al composition ratio to the sixth layer 56 that has the low Al composition ratio. Thereby, for example, a large compressive stress can be applied to the sixth layer 56. The nitride semiconductor wafer 110 includes the second layer 52 and the third layer 53. Coherent growth of the second layer 52 is performed. The third layer 53 is grown to avoid lattice relaxation as much as possible. Thereby, for example, the compressive stress due to the difference between the lattice constants of the first layer 51 (the AlN layer) and the sixth layer 56 (the GaN layer) can be applied efficiently to the sixth layer 56.

The mismatch between the lattice constants of the AlN layer and the GaN layer is large. Therefore, in the case where the GaN layer is provided on the AlN layer, it is difficult to completely suppress the occurrence of dislocations. Therefore, in the nitride semiconductor wafer 110, the Al composition ratio is changed in stages for the second layer 52 and the third layer 53; and the Al composition ratio of the fourth layer 54 is reduced gradually. Thereby, for example, dislocations are caused to occur in the second layer 52 and the third layer 53; and the dislocations in the fourth to sixth layers 54 to 56 can be reduced. Thereby, for example, the dislocations of the sixth layer 56 can be reduced.

For example, the Al composition ratio of the fourth layer 54 is reduced continuously. The difference between the Al composition ratios of the fifth layer 55 and the sixth layer 56 is set to be smaller than the difference between the Al composition ratios of the first layer 51 and the second layer 52 and the difference between the Al composition ratios of the second layer 52 and the third layer 53. Thereby, for example, the dislocations of the fourth to sixth layers 54 to 56 can be reduced more appropriately.

In the case where Ga is added to AlN, the properties change when 25% Ga or more is added. Generally, 25% is called the critical point. 25% is the structure in which one Ga atom is added to four Al atoms. For example, when doping Si, etc., the properties change when 25% or more is added. Accordingly, the Al composition ratio x2 of the second layer 52 is set to be in the range of $0.7 \leq x2 < 0.8$. Thereby, for example, compressive stress can be applied appropriately to the second layer 52 while suppressing the lattice relaxation of the second layer 52. For example, dislocations can be caused to occur in the second layer 52.

The growth conditions of the AlGaN layer (the AlN layer) differ greatly for Al composition ratios in the range of 100% to 70%. Therefore, for Al composition ratios in the range of 100% to 70%, there is a possibility that the growth conditions may undesirably depart from the range of appropriate growth conditions when the Al composition ratio is to be continuously changed. When the growth conditions depart from the appropriate growth conditions, for example, appropriate crystal growth can no longer be obtained. For example, a growth mode occurs in which gaps undesirably occur. Accordingly, for example, the occurrence of crystal defects in the second layer 52 and the third layer 53 can be suppressed by changing the Al composition ratio in stages in the second layer 52 and the third layer 53.

For the third layer 53, the quality of the film that is obtained is better as the mismatch between the lattice constants of the third layer 53 and the first layer 51 (the AlN layer) and the mismatch between the lattice constants of the third layer 53 and the sixth layer 56 (the GaN layer) are reduced. Accordingly, the Al composition ratio x3 of the third layer 53 is set to be $0.4 \leq x3 \leq 0.6$. Thereby, for example, the flatness of the upper surface can be improved. It is more favorable for the composition ratio x3 to be $0.45 \leq x3 \leq 0.55$ and optimal to be 0.5.

Further, the inventors of the application discovered that, in the case where multiple AlGaN layers having different Al composition ratios are stacked on an AlN layer, the properties change greatly at an Al composition ratio near 0.3. For example, when an $Al_{0.3}Ga_{0.7}N$ layer is stacked on an $Al_{0.5}Ga_{0.5}N$ layer, the flatness of the upper surface of the $Al_{0.3}Ga_{0.7}N$ layer degrades.

In the nitride semiconductor wafer 110, the Al composition ratio x4 is changed gradually for the fourth layer 54 that includes the Al composition ratio near 0.3. In other words, the Al composition ratio does not change abruptly when the Al composition ratio is near 0.3. Thereby, the change of the properties when the Al composition ratio is near 0.3 can be suppressed. For example, the flatness of the upper surface of the fourth layer 54 can be improved.

Figure 10:
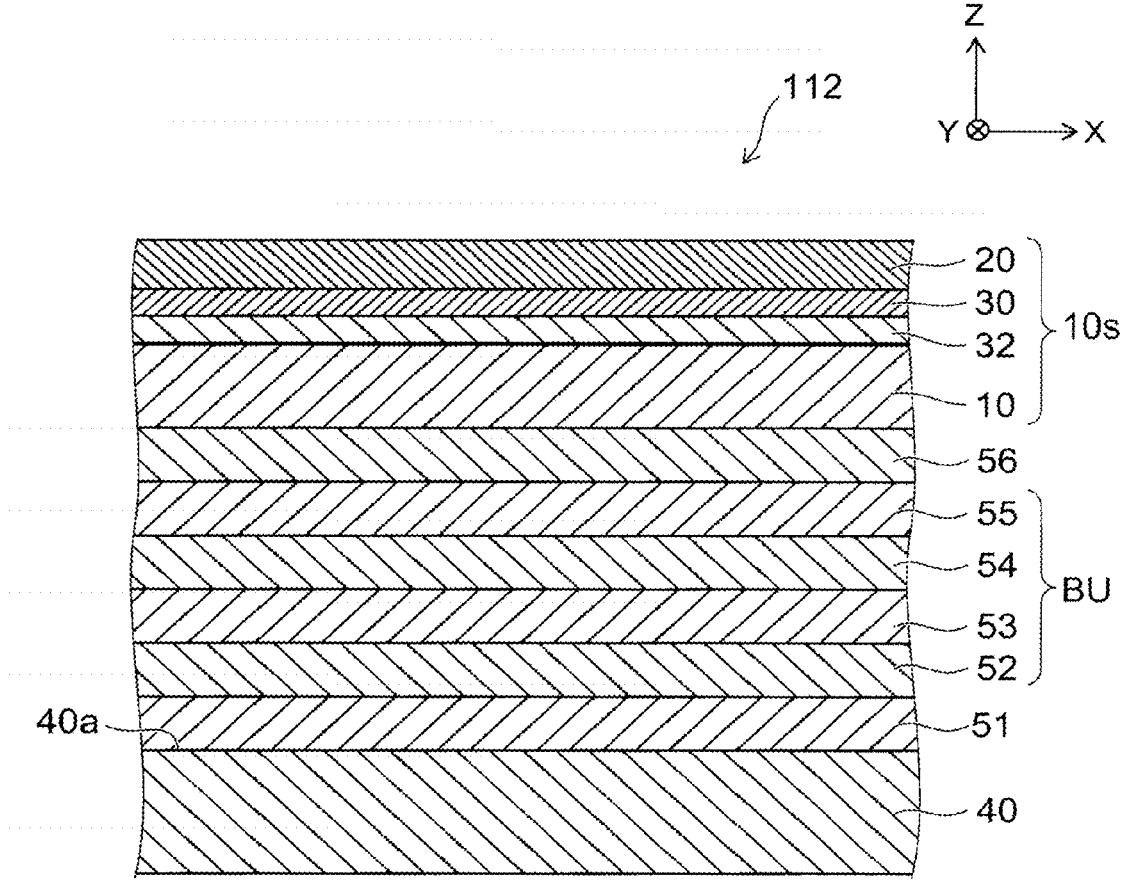
FIG. 10 is a cross-sectional view schematically showing another nitride semiconductor wafer according to the first embodiment.

FIG. 10 is a cross-sectional view schematically showing another nitride semiconductor wafer according to the first embodiment.

As shown in FIG. 10, the nitride semiconductor wafer 112 further includes a functional layer 10s. The functional layer 10s is provided on the sixth layer 56. In the example, the functional layer 10s includes a first semiconductor layer 10, a second semiconductor layer 20, a light emitting layer 30, and a stacked unit 32. In other words, the nitride semiconductor wafer 112 is a wafer for manufacturing a semiconductor light emitting element as a nitride semiconductor element. In particular, the nitride semiconductor wafer 112 is a wafer to manufacture an LED.

The first semiconductor layer 10 is provided on the sixth layer 56. The first semiconductor layer 10 includes a nitride semiconductor. The first semiconductor layer 10 includes, for example, GaN of a first conductivity type. The first conductivity type is an n-type; and a second conductivity type is a p-type. The first conductivity type may be the p-type; and the second conductivity type may be the n-type. Hereinbelow, the case is described where the first conductivity type is the n-type and the second conductivity type is the p-type. The first semiconductor layer 10 is, for example, an n-type GaN layer.

The stacked unit 32 is provided on the first semiconductor layer 10. The light emitting layer 30 is provided on the stacked unit 32. In other words, the light emitting layer is provided on the first semiconductor layer 10; and the stacked unit 32 is provided between the first semiconductor layer 10 and the light emitting layer 30. The second semiconductor layer 20 is provided on the light emitting layer 30. The second semiconductor layer 20 includes a nitride semiconductor and has the second conductivity type. The second semiconductor layer 20 is, for example, a p-type GaN layer. Light is emitted from the light emitting layer 30 by causing a current to flow in the light emitting layer 30 via the first semiconductor layer 10 and the second semiconductor layer 20. The stacked unit 32 is provided in the functional layer 10s as appropriate and is omissible. Thus, the functional layer 10s includes a nitride semiconductor. The functional layer 10s includes, for example, GaN.

Figure 11A:
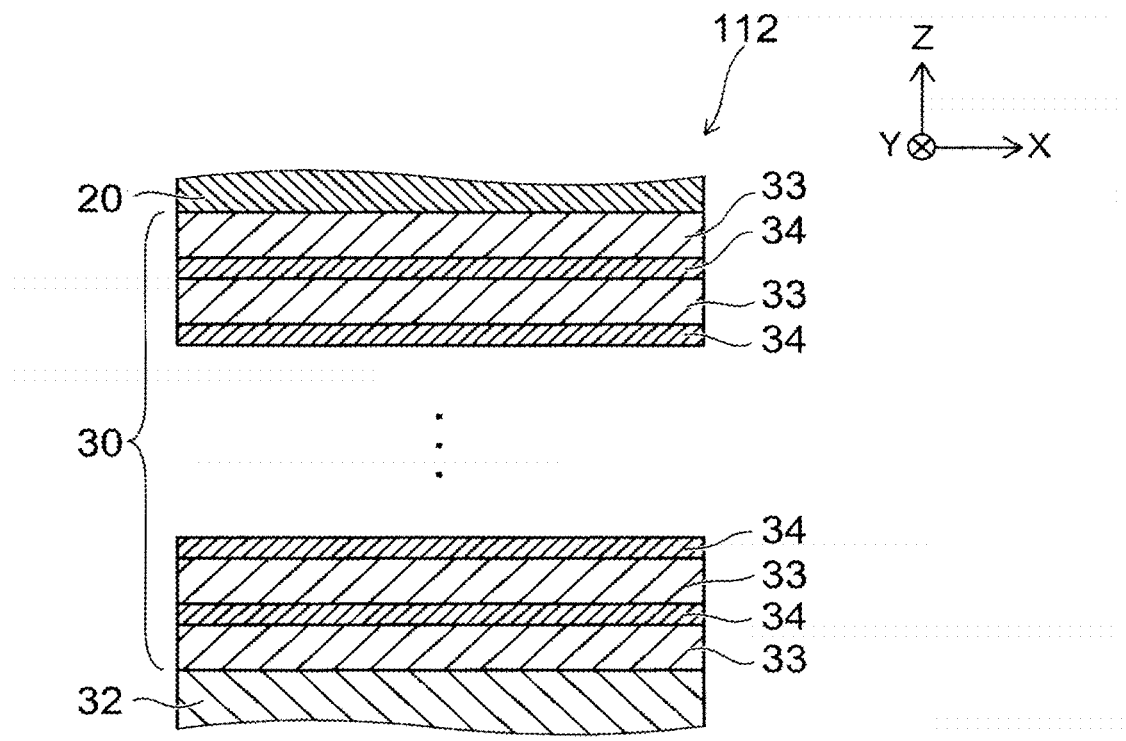
FIGS. 11A and 11B are cross-sectional views schematically showing a portion of the nitride semiconductor wafer according to the first embodiment.
Figure 11B:
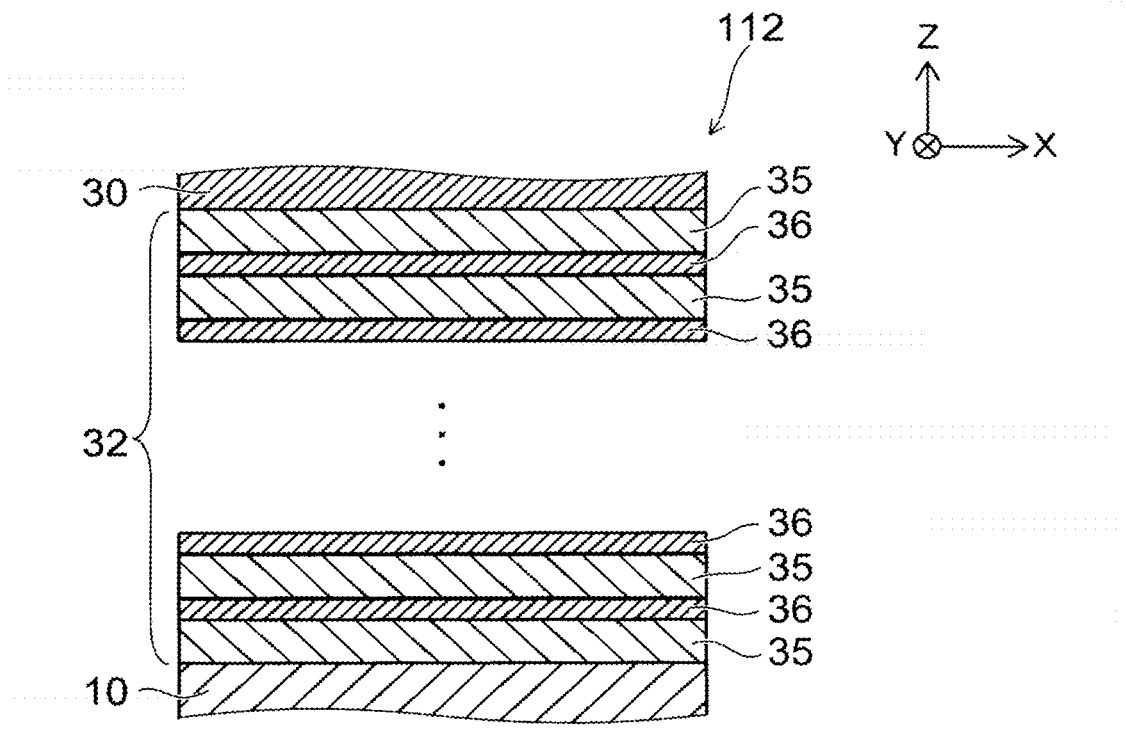

FIGS. 11A and 11B are cross-sectional views schematically showing a portion of the nitride semiconductor wafer according to the first embodiment.

As shown in FIG. 11A, the light emitting layer 30 includes multiple barrier layers 33, and well layers 34 provided between the multiple barrier layers 33. For example, the multiple barrier layers 33 and the multiple well layers 34 are stacked alternately along the Z-axis direction.

The number of the well layers 34 may be one, two, or more. In other words, the light emitting layer 30 may have a SQW (Single-Quantum Well) structure or a MQW (Multiple Quantum Well) structure.

The bandgap energy each of the barrier layers 33 is higher than the bandgap energy each of the well layers 34. The well layers 34 include, for example, $In_\alpha Ga_{1-\alpha}N$ (0<α<1). The barrier layers 33 include, for example, GaN.

The barrier layers 33 include a nitride semiconductor including a group III element and a group V element. The well layers 34 include a nitride semiconductor including a group III element and a group V element. The well layers 34 include, for example, a nitride semiconductor including indium (In) and gallium (Ga).

As shown in FIG. 11B, the stacked unit 32 includes multiple high bandgap energy layers 35 and multiple low bandgap energy layers 36 stacked alternately in the Z-axis direction. The multiple high bandgap energy layers 35 include a nitride semiconductor. The multiple low bandgap energy layers 36 include a nitride semiconductor. The multiple low bandgap energy layers 36 are provided respectively between the multiple high bandgap energy layers 35. The bandgap energy each of the multiple low bandgap energy layers 36 is lower than the bandgap energy each of the multiple high bandgap energy layers 35. The bandgap energy each of the multiple low bandgap energy layers 36 is higher than the bandgap energy each of the multiple well layers 34.

The stacked unit 32 is, for example, a superlattice layer.

The high bandgap energy layers 35 include a nitride semiconductor including a group III element and a group V element. The low bandgap energy layers 36 include a nitride semiconductor including a group III element and a group V element. The low bandgap energy layers 36 include, for example, a nitride semiconductor including In and Ga.

Figure 12A:
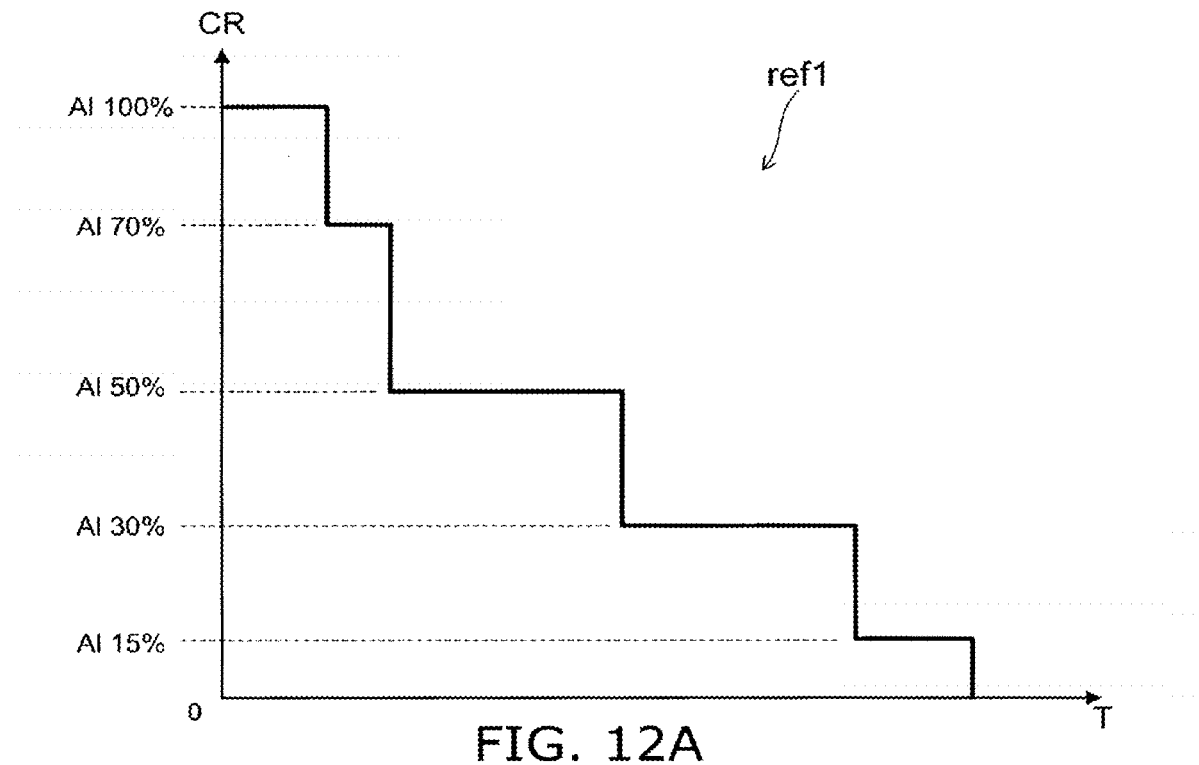
FIGS. 12A and 12B are graphs showing characteristics of nitride semiconductor wafers of reference examples.
Figure 12B:
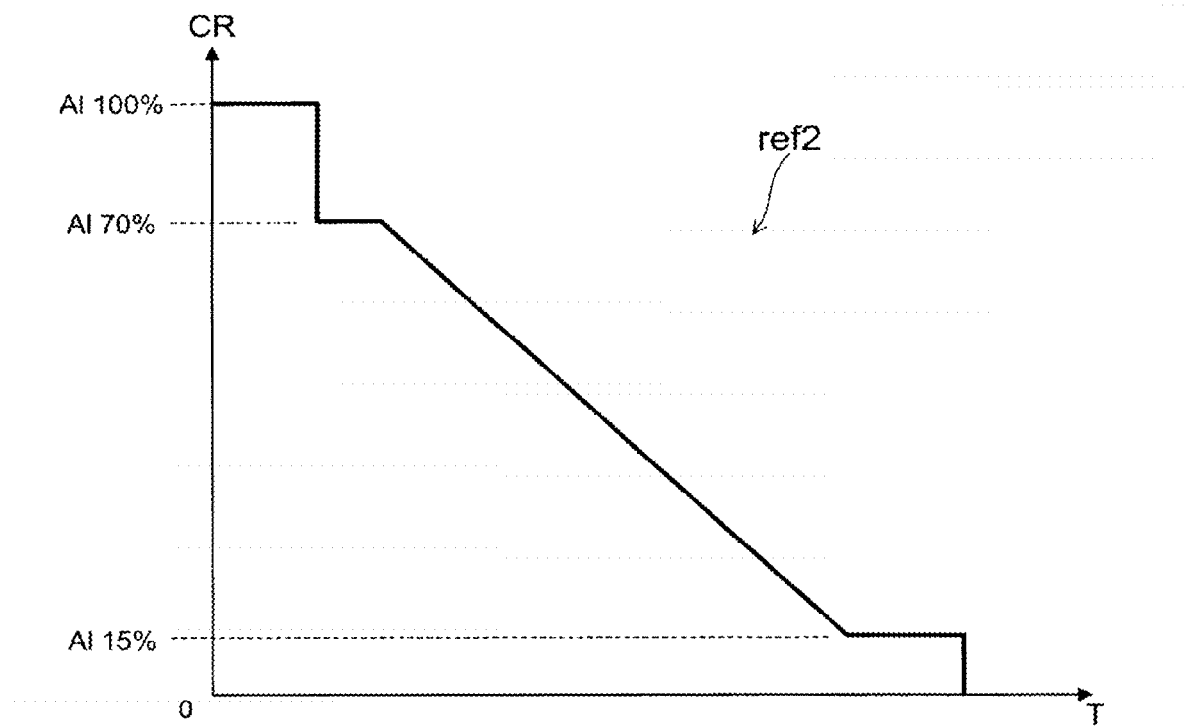

FIGS. 12A and 12B are graphs showing characteristics of nitride semiconductor wafers of reference examples.

FIG. 12A shows a characteristic of a nitride semiconductor wafer ref1 of a first reference example. FIG. 12B shows a characteristic of a nitride semiconductor wafer ref2 of a second reference example. In FIGS. 12A and 12B, the relationship between the vertical axis and the horizontal axis is substantially the same as that of the vertical axis and the horizontal axis of FIG. 2.

In the case where a GaN layer is provided on a substrate including silicon, it is difficult to form the GaN directly on the substrate including silicon due to, for example, the difference between the lattice constants of the silicon and the GaN. Therefore, the difference between the lattice constants, etc., are changed gradually by providing AlN layers and/or AlGaN layers between the GaN layer and the substrate including silicon. The inventors of the application performed diligent investigations of the relationships between cracks of the wafer and the number of layers and Al composition ratios of the AlGaN layers. The first reference example and the second reference example are samples that were made in the course of investigation.

As shown in FIG. 12A, an AlGaN layer in which the Al composition ratio is changed continuously is not provided in the nitride semiconductor wafer ref1. The nitride semiconductor wafer ref1 includes only AlGaN layers in which the Al composition ratio is changed in stages. Specifically, an AlN layer, an $Al_xGa_{1-x}N$ layer (x=0.7), an $Al_xGa_{1-x}N$ layer (x=0.5), an $Al_xGa_{1-x}N$ layer (x=0.3), an $Al_xGa_{1-x}N$ layer (x=0.15), and a GaN layer are stacked sequentially on the silicon substrate. Further, a functional layer 10s that is similar to that of the nitride semiconductor wafer 112 is provided on the GaN layer in the nitride semiconductor wafer ref1. In other words, the nitride semiconductor wafer ref1 has the structure of a light emitting element.

As shown in FIG. 12B, an AlGaN layer having a large change amount of the Al composition ratio is provided in the nitride semiconductor wafer ref2. Specifically, an AlN layer, an $Al_xGa_{1-x}N$ layer (x=0.7), an AlGaN layer for which the Al composition ratio is reduced continuously from 0.7 to 0.15, an $Al_xGa_{1-x}N$ layer (x=0.15), and a GaN layer are stacked sequentially on the silicon substrate. In the nitride semiconductor wafer ref2 as well, a functional layer 10s that is similar to that of the nitride semiconductor wafer 112 is provided on the GaN layer. The nitride semiconductor wafer ref2 also has the structure of a light emitting element.

Figures 13, 14:
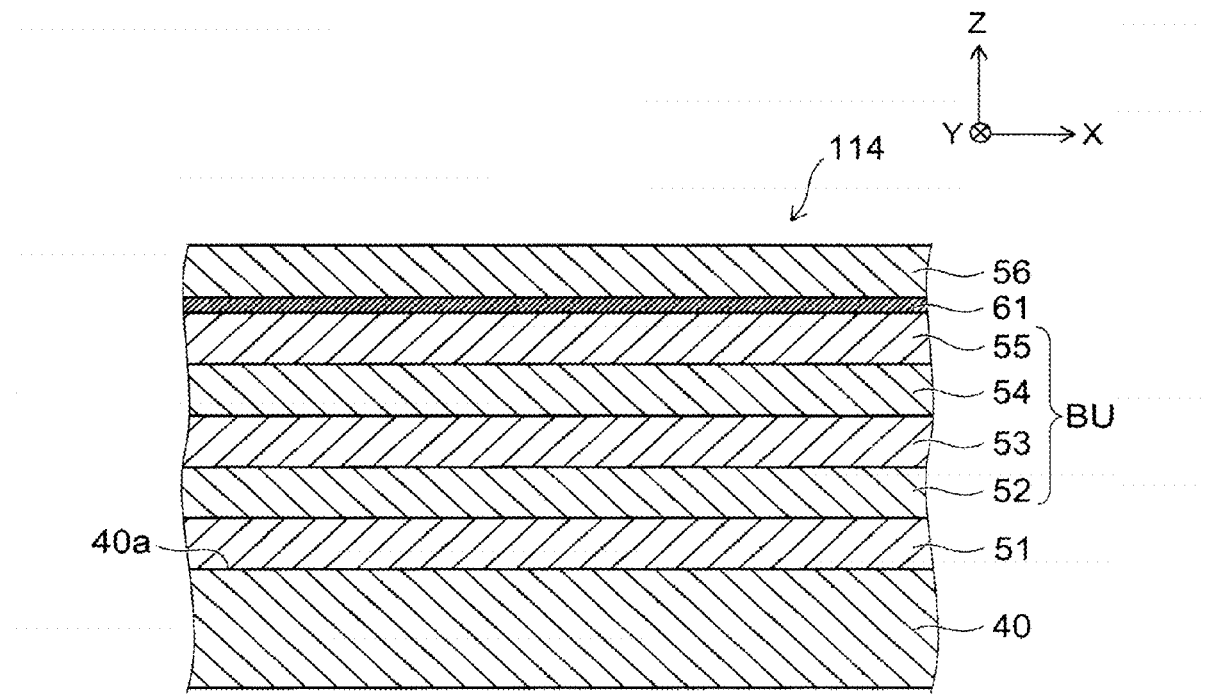
FIG. 13 is a table showing an example of characteristics of the nitride semiconductor wafers according to the first embodiment.
FIG. 14 is a cross-sectional view schematically showing another nitride semiconductor wafer according to the first embodiment.

FIG. 13 is a table showing an example of characteristics of the nitride semiconductor wafers according to the first embodiment.

FIG. 13 shows the results when a dislocation density Ns ($cm^{-2}$) of the screw dislocation component, a dislocation density Ne ($cm^{-2}$) of the edge dislocation component, and a light output LO were determined for the nitride semiconductor wafer 112, the nitride semiconductor wafer ref1, and the nitride semiconductor wafer ref2. The dislocation densities Ns and Ne were determined by X-ray diffraction.

As shown in FIG. 13, the dislocation densities Ns and Ne of the nitride semiconductor wafer 112 are lower than the dislocation densities Ns and Ne of the nitride semiconductor wafers ref1 and ref2. Also, the light output LO of the nitride semiconductor wafer 112 is higher than the light outputs LO of the nitride semiconductor wafers ref1 and ref2. For example, the light output LO of the nitride semiconductor wafer ref1 is about 25% lower than the light output LO of the nitride semiconductor wafer 112. For the nitride semiconductor wafer ref2, there were many cracks in the wafer state; and the cracks increased further in the course of the element singulation process. Therefore, it was difficult for the nitride semiconductor wafer ref2 to operate as a light emitting element; and the light output LO could not be determined appropriately.

Thus, the cracks can be suppressed more for the nitride semiconductor wafer 112 according to the embodiment than for the nitride semiconductor wafers ref1 and ref2. The dislocation densities Ns and Ne can be reduced further for the nitride semiconductor wafer 112 than for the nitride semiconductor wafers ref1 and ref2. Further, the light output LO can be increased when the wafer is used to manufacture a light emitting element. For example, an LED that irradiates near-ultraviolet light of a wavelength of about 200 nm to 380 nm is easily affected by the dislocation density. For the nitride semiconductor wafer 112, a high light output LO can be obtained for the LED that irradiates near-ultraviolet light as well.

In the nitride semiconductor wafers 110 and 112 according to the embodiment, the compressive stress based on the lattice constant difference between AlN and GaN can be applied efficiently to the GaN layer while being controlled by the buffer unit BU. For example, the stress is not transmitted when abrupt lattice relaxation is caused to occur. The lattice relaxation undesirably occurs due to the flatness and differences in the compositions. In the nitride semiconductor wafers 110 and 112, the Al composition ratio is reduced in stages in the portions that have high Al composition ratios where the lattice relaxation occurs easily. The flatness is better for the layers 51 to 56. Thereby, the compressive stress can be efficiently transmitted to the upper layer. Then, the lattice relaxation is suppressed by reducing the composition ratio while maintaining the flatness where the Al composition ratio is 0.5 or less. As a result, it is possible to apply compressive stress to the sixth layer 56 (the GaN layer).

For example, in the case where the range of the change of the Al composition ratio of the AlGaN layer is wide, the crystal quality degrades for the portion that has the high Al composition ratio. For example, lattice relaxation occurs in the portion that has the high Al composition ratio. Therefore, it is considered that the cracks occur in the nitride semiconductor wafer ref2 because, for example, the nitride semiconductor wafer ref2 cannot withstand the stress in the element singulation.

FIG. 14 is a cross-sectional view schematically showing another nitride semiconductor wafer according to the first embodiment.

As shown in FIG. 14, the nitride semiconductor wafer 114 further includes a first silicon-containing unit 61. The first silicon-containing unit 61 is provided on the fifth layer 55. In the nitride semiconductor wafer 114, the sixth layer 56 is provided on the first silicon-containing unit 61. In other words, the first silicon-containing unit 61 is provided between the fifth layer 55 and the sixth layer 56. The first silicon-containing unit 61 is provided between the buffer unit BU that includes AlGaN and the sixth layer 56 that includes GaN. For example, in the example, the first silicon-containing unit 61 contacts the fifth layer 55; and the sixth layer 56 contacts the first silicon-containing unit 61.

The thickness of the first silicon-containing unit 61 is, for example, not less than 0.3 atomic layers thick and not more than 2.0 atomic layers thick, and favorably not less than 0.5 atomic layers thick and not more than 0.5 atomic layers thick. The first silicon-containing unit 61 includes silicon. The first silicon-containing unit 61 includes, for example, GaN to which silicon is added at a high concentration. The first silicon-containing unit 61 may include, for example, SiN. The concentration of the silicon included in the first silicon-containing unit 61 is, for example, not less than $6.2 \times 10^{19}$ cm$^{-2}$ and not more than $4.0 \times 10^{20}$ cm$^{-2}$, and favorably not less than $1.0 \times 10^{20}$ cm$^{-2}$ and not more than $2.8 \times 10^{20}$ cm$^{-2}$. For example, the first silicon-containing unit 61 further reduces the dislocation density.

The first silicon-containing unit 61 may be provided in a film-like configuration on the fifth layer 55 or may be provided in an island configuration on the fifth layer 55. In other words, the first silicon-containing unit 61 may be provided on the entire fifth layer 55 or may be provided partially on the fifth layer 55.

The first silicon-containing unit 61 may be, for example, a portion of the fifth layer 55. In other words, the fifth layer 55 may include a region having a high silicon concentration at the vicinity of the interface between the fifth layer 55 and the sixth layer 56. The first silicon-containing unit 61 may be a portion of the sixth layer 56. In other words, the sixth layer 56 may include a region having a high silicon concentration at the vicinity of the interface between the sixth layer 56 and the fifth layer 55.

FIGS. 15A to 15G are cross-sectional views schematically showing a method for manufacturing the nitride semiconductor wafer according to the first embodiment.

FIGS. 15A to 15G schematically show the method for manufacturing the nitride semiconductor wafer 114. The manufacturing method shown in FIGS. 15A to 15G also can be applied to the manufacture of the nitride semiconductor wafers 110 and 112 except for the portion of the first silicon-containing unit 61. In the nitride semiconductor wafer 114, the crystal growth method of the layers 51 to 56 includes, for example, MOCVD.

When manufacturing the nitride semiconductor wafer 114, first, the substrate 40 of Si (111) is cleaned for 5 minutes using a 1:1 mixed liquid of $H_2O_2$ and $H_2SO_4$. Then, the substrate 40 is cleaned for 3 minutes using a dilute hydrofluoric acid solution (having a hydrofluoric acid concentration of 2%). After the cleaning, the substrate 40 is mounted on the susceptor (the support platform) inside a MOCVD reaction chamber.

Figure 15A:
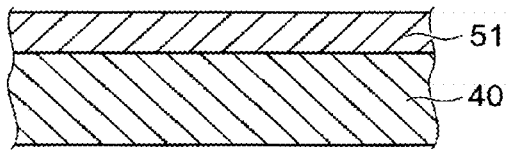
FIGS. 15A to 15G are cross-sectional views schematically showing a method for manufacturing the nitride semiconductor wafer according to the first embodiment.

As shown in FIG. 15A, the first layer 51 is formed on the substrate 40. To form the first layer 51, for example, the susceptor is heated to 1080° C.; and tri-methyl aluminum (TMA) is supplied to the reaction chamber for 0.2 seconds at a flow rate of 200 ccm (cc/min). Subsequently, $NH_3$ is supplied at a flow rate of 20 sccm (standard cubic centimeter per minute). Thereby, a first AlN layer 51a of about 12 nm is formed on the substrate 40. Subsequently, the temperature of the susceptor is increased to 1250° C.; and a second AlN layer 51b of about 200 nm is formed on the first AlN layer 51a. Thereby, for example, the first layer 51 including AlN is formed on the substrate 40.

Figure 15B:
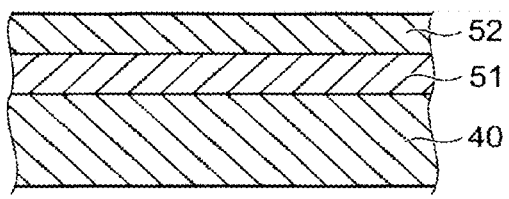

As shown in FIG. 15B, the second layer 52 is formed on the first layer 51. To form the second layer 52, for example, the temperature of the susceptor is reduced to about 1230° C.; and tri-methyl gallium (TMG) is supplied to the reaction chamber at a flow rate of 14 sccm. Thereby, for example, an $Al_{0.75}Ga_{0.25}N$ layer of about 100 nm is formed on the first layer 51 as the second layer 52.

Figure 15C:
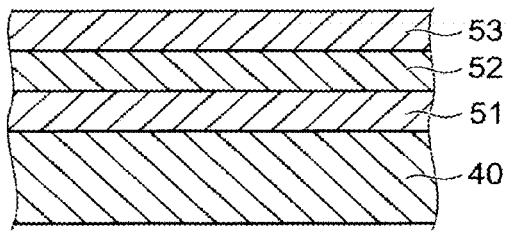

As shown in FIG. 15C, the third layer 53 is formed on the second layer 52. To form the third layer 53, for example, the temperature of the susceptor is reduced to about 1140° C.; and the supply amounts of TMG and TMA are set to values corresponding to those of the third layer 53. For example, the flow rate of TMG is set to be 17 sccm; and the flow rate of TMA is set to be 50 sccm. Thereby, for example, an $Al_{0.5}Ga_{0.5}N$ layer of about 100 nm is formed on the second layer 52 as the third layer 53.

Figure 15D:
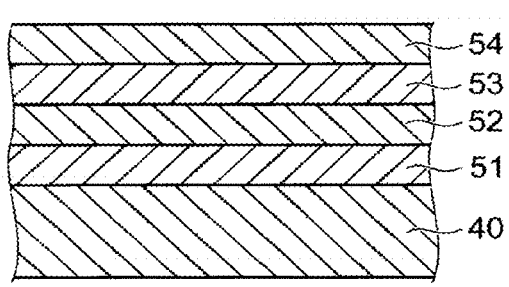

As shown in FIG. 15D, the fourth layer 54 is formed on the third layer 53. To form the fourth layer 54, for example, the temperature of the susceptor is held at 1140° C.; and the supply amounts of TMG and TMA are changed gradually. Thereby, an AlGaN layer of about 300 nm for which the Al composition ratio is changed from 50% to 30% is formed on the third layer 53. Subsequently, the temperature of the susceptor is reduced to 1120° C.; and an AlGaN layer of about 300 nm for which the Al composition ratio is changed from 30% to 15% is formed while gradually changing the supply amounts of TMG and TMA. Thereby, for example, the fourth layer 54 for which the Al composition ratio is changed from 50% to 15% is formed on the third layer 53.

Figure 15E:
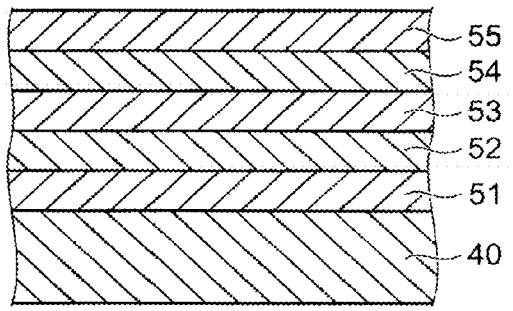

As shown in FIG. 15E, the fifth layer 55 is formed on the fourth layer 54. To form the fifth layer 55, for example, the temperature of the susceptor is held at about 1120° C.; and the supply amounts of TMG and TMA are set to values corresponding to those of the fifth layer 55. For example, the flow rate of TMG is set to be 33 sccm; and the flow rate of TMA is set to be 13 sccm. Thereby, for example, an $Al_{0.15}Ga_{0.85}N$ of about 200 nm is formed on the fourth layer 54 as the fifth layer 55.

Figure 15F:
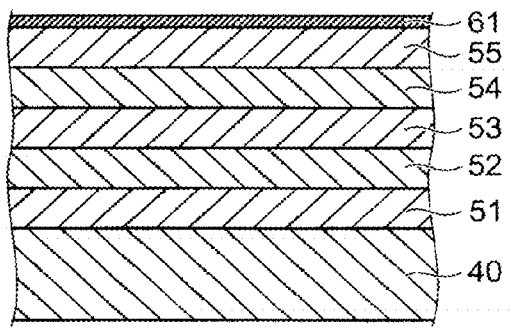

As shown in FIG. 15F, the first silicon-containing unit 61 is formed on the fifth layer 55. To form the first silicon-containing unit 61, for example, the temperature of the susceptor is reduced to 1000° C.; and $SiH_4$ is supplied to the reaction chamber for 150 seconds at a flow rate of 280 sccm (280 ml (liters/minute)). Thereby, for example, the first silicon-containing unit 61 including SiN is formed on the fifth layer 55.

Figure 15G:
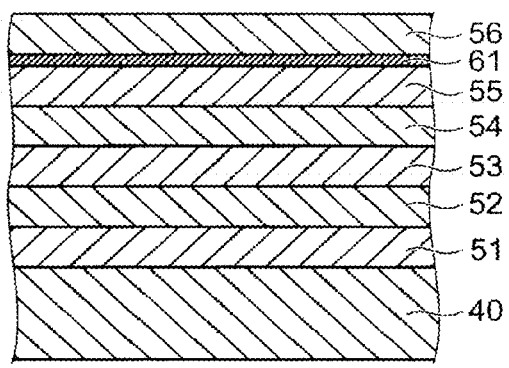

As shown in FIG. 15G, the sixth layer 56 is formed on the first silicon-containing unit 61. To form the sixth layer 56, for example, the temperature of the susceptor is increased to 1160° C.; and TMG is supplied to the reaction chamber at a flow rate of 60 sccm. Thereby, for example, a GaN layer of about 1.8 is formed on the first silicon-containing unit 61 as the sixth layer 56.

Thus, the nitride semiconductor wafer 114 is completed. Thereby, for example, a high-quality GaN layer that is subjected to compressive strain can be formed as the sixth layer 56.

In the nitride semiconductor wafer 114, good flatness of the upper surface of the fifth layer 55 can be obtained. For example, the surface roughness Ra of the upper surface of the fifth layer 55 can be 6 nm or less. Therefore, in the nitride semiconductor wafer 114, for example, the first silicon-containing unit 61 (e.g., SiN) can be provided substantially uniformly on the entire upper surface of the fifth layer 55.

Multiple samples were made for which the thickness (the deposition time) of the first silicon-containing unit 61 was changed; and the crystal quality of the sixth layer 56 (the GaN layer) was compared for the samples. For example, the dislocation densities were compared. As a result, it was found that good crystal quality of the sixth layer 56 is obtained in the case where the thickness of the first silicon-containing unit 61 is about 1 atomic layers thick. Also, it was found that the optimal range of the thickness of the first silicon-containing unit 61 is narrow. The optimal range of the thickness of the first silicon-containing unit 61 is, for example, not less than 0.3 atomic layers thick and not more than 2.0 atomic layers thick.

The first silicon-containing unit 61 is easily affected by the flatness of the foundation layer. In the nitride semiconductor wafer 114, the flatness of the upper surface of the fifth layer 55 can be good. Thereby, in the nitride semiconductor wafer 114, the crystal quality of the sixth layer 56 can be improved by providing the first silicon-containing unit 61. For example, the dislocation density of the sixth layer 56 can be reduced.

Figure 16A:
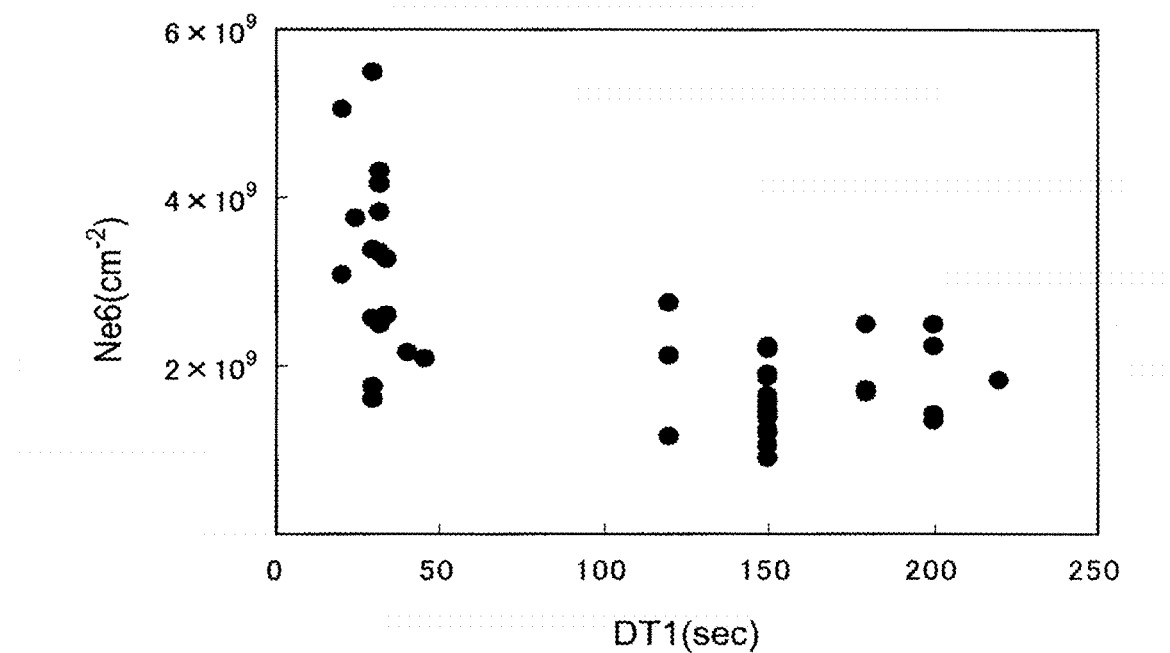
FIGS. 16A and 16B are graphs showing characteristics of the nitride semiconductor wafer according to the first embodiment.
Figure 16B:
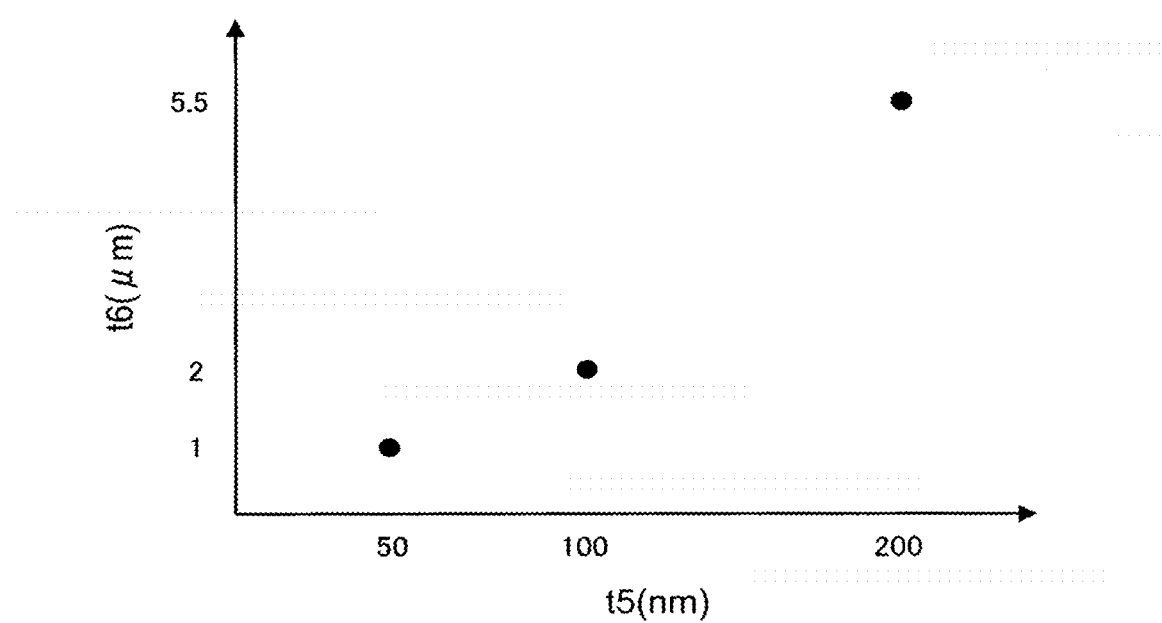

FIGS. 16A and 16B are graphs showing characteristics of the nitride semiconductor wafer according to the first embodiment.

FIG. 16A shows the relationship between a deposition time DT1 of the first silicon-containing unit 61 and a dislocation density Ne6 of the edge dislocation component of the sixth layer 56. In FIG. 16A, the vertical axis is the dislocation density Ne6 ($cm^{-2}$) of the edge dislocation component of the sixth layer 56; and the horizontal axis is the deposition time DT1 (seconds) of the first silicon-containing unit 61.

As shown in FIG. 16A, the effect of reducing the dislocation density Ne6 is small when the deposition time DT1 of the first silicon-containing unit 61 is too short (50 seconds or less). The dislocation density Ne6 can be reduced favorably when the deposition time DT1 is not less than 100 seconds and not more than 200 seconds. Then, when the deposition time DT1 is about 150 seconds, the dislocation density Ne6 can be stably reduced. When the deposition time DT1 is 200 seconds or more, for example, pits, etc., occur in the upper surface of the first silicon-containing unit 61. When the deposition time DT1 is too long, for example, the upper surface of the fifth layer 55 is damaged; and the SiN coalesces and is no longer distributed uniformly. Therefore, the dislocation density Ne6 no longer decreases easily; and, for example, the flatness of the upper surface of the first silicon-containing unit 61 degrades. The relationship between the deposition time DT1 and the thickness of the first silicon-containing unit 61 was considered to be linear. In other words, when the deposition time DT1 is 150 seconds, the thickness of the first silicon-containing unit 61 is about 1 atomic layers thick.

FIG. 16B shows the relationship between the thickness t5 of the fifth layer 55 and a thickness t6 of the sixth layer 56. In FIG. 16B, the vertical axis is the thickness t6 (μm) of the sixth layer 56; and the horizontal axis is the thickness t5 (nm) of the fifth layer 55.

The flatness of the upper surface of the fifth layer 55 changes when the thickness of the fifth layer 55 is changed. For example, in the case where the thickness is thin, the fifth layer 55 has a morphology in which small lumps are dense at the upper surface; and the lumps grow larger as the fifth layer 55 becomes thick. After the first silicon-containing unit 61 is stacked on the fifth layer 55, the sixth layer 56 is grown. The GaN of the sixth layer 56 starts to grow in an island configuration and progresses gradually to grow in the horizontal direction. Then, finally, the islands combine with each other to become flat. The dislocations decrease in the case where the combination of the islands with each other is smooth. On the other hand, conversely, the dislocations increase in the case where the facet surfaces of the islands are shifted from each other or in the case where the island sizes are nonuniform.

The inventors of the application discovered that there is a relationship between the state of the upper surface of the fifth layer 55 and the thickness of the sixth layer 56 when the sixth layer 56 becomes flat.

FIG. 16B shows the relationship between the thickness t5 of the fifth layer 55 and the thickness t6 of the sixth layer 56 necessary for the GaN to become flat. For example, when the thickness t5 of the fifth layer 55 is thin, the sizes of the GaN islands are small; and the islands are densely disposed. Therefore, the thickness t6 that is necessary for flatness is thin. On the other hand, when the thickness t5 of the fifth layer 55 is thick, the sizes of the GaN islands are large; and the islands are distal to each other. Therefore, the thickness t6 that is necessary for flatness is thick. Thus, the sizes of the GaN islands and the thickness t6 of the sixth layer 56 that is necessary for flatness are controlled by adjusting the thickness t5 of the fifth layer 55.

In the case where crack countermeasures are given priority, it is good for the sixth layer 56 to be thin. Accordingly, the thickness t5 of the fifth layer 55 is set to be thin. On the other hand, in the case where it is important to reduce the dislocation density, the thickness t5 of the fifth layer 55 is set to be thick.

Figure 17:
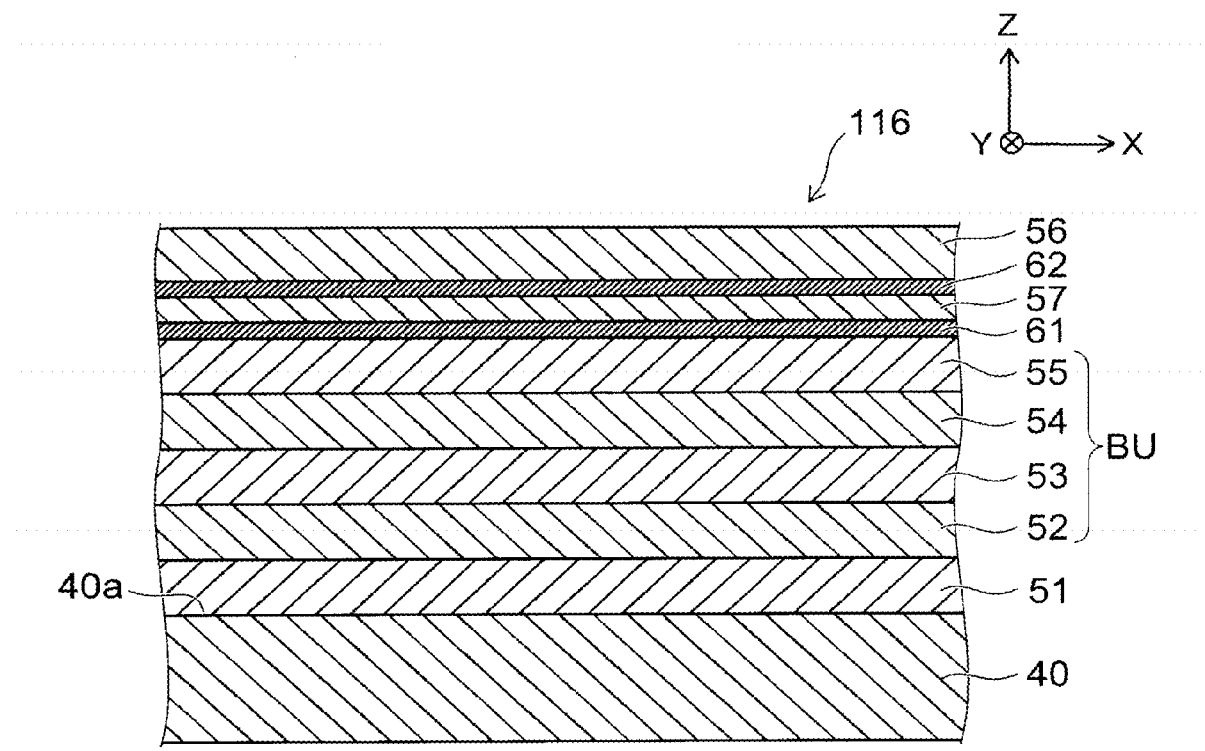
FIG. 17 is a cross-sectional view schematically showing another nitride semiconductor wafer according to the first embodiment.

FIG. 17 is a cross-sectional view schematically showing another nitride semiconductor wafer according to the first embodiment.

As shown in FIG. 17, the nitride semiconductor wafer 116 further includes a seventh layer 57 and a second silicon-containing unit 62. Thus, two silicon-containing units, i.e., the first and second silicon-containing units 61 and 62, may be provided. Thereby, for example, the dislocation density can be reduced further.

The seventh layer 57 is provided between the first silicon-containing unit 61 and the sixth layer 56. The seventh layer 57 includes, for example, $Al_{x7}Ga_{1-x7}N$ ($0 \leq x7 < x5$). The seventh layer 57 is, for example, a GaN layer. In particular, the seventh layer 57 is a GaN layer grown in an island configuration. The thickness of the seventh layer 57 is, for example, 200 nm (not less than 100 nm and not more than 300 nm).

The second silicon-containing unit 62 is provided between the sixth layer 56 and the seventh layer 57. In the example, for example, the first silicon-containing unit 61 contacts the fifth layer 55; the seventh layer 57 contacts the first silicon-containing unit 61; the second silicon-containing unit 62 contacts the seventh layer 57; and the sixth layer 56 contacts the second silicon-containing unit 62.

The second silicon-containing unit 62 includes silicon. The second silicon-containing unit 62 includes, for example, SiN. The material, thickness, silicon concentration, etc., of the second silicon-containing unit 62 may be substantially the same as those of the first silicon-containing unit 61. Accordingly, a description thereof is omitted.

In the example, the first silicon-containing unit 61 may be, for example, a portion of the seventh layer 57. In other words, the seventh layer 57 may include a region having a high silicon concentration at the vicinity of the interface between the seventh layer 57 and the fifth layer 55. The second silicon-containing unit 62 may be a portion of the seventh layer 57. In other words, the seventh layer 57 may include a region having a high silicon concentration at the vicinity of the interface between the seventh layer 57 and the sixth layer 56. The second silicon-containing unit 62 may be a portion of the sixth layer 56. In other words, the sixth layer 56 may include a region having a high silicon concentration at the vicinity of the interface between the sixth layer 56 and the seventh layer 57.

When manufacturing the nitride semiconductor wafer 116, for example, the temperature of the susceptor is increased to 1070° C. after forming the first silicon-containing unit 61 as described in regard to FIG. 15F. Then, a GaN layer of about 200 nm is formed on the first silicon-containing unit 61 as the seventh layer 57. At this time, the GaN grows in an island configuration.

After the formation of the seventh layer 57, $SiH_4$ is supplied to the reactor for 60 seconds at a flow rate of 280 ml (liters/minute) with the temperature of the susceptor held at 1070° C. Thereby, the second silicon-containing unit 62 is formed on the seventh layer 57.

After the formation of the second silicon-containing unit 62, the temperature of the susceptor is increased to 1160° C. Then, a GaN layer of about 1.8 μm is formed on the second silicon-containing unit 62 as the sixth layer 56.

Thus, the nitride semiconductor wafer 116 is completed.

Figure 18:
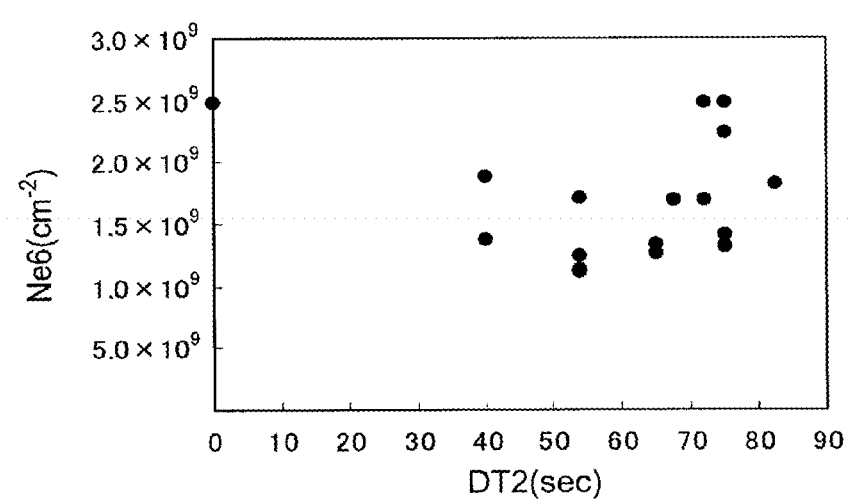
FIG. 18 is a graph showing characteristics of the nitride semiconductor wafer according to the first embodiment.

FIG. 18 is a graph showing characteristics of the nitride semiconductor wafer according to the first embodiment.

FIG. 18 shows the relationship between a deposition time DT2 of the second silicon-containing unit 62 and the dislocation density Ne6 of the edge dislocation component of the sixth layer 56. The vertical axis of FIG. 18 is the dislocation density Ne6 ($cm^{-2}$) of the edge dislocation component of the sixth layer 56; and the horizontal axis of FIG. 18 is the deposition time DT2 (seconds) of the second silicon-containing unit 62.

As shown in FIG. 18, the dislocation density Ne6 decreases in a range in which the deposition time DT2 is not less than 50 seconds and not more than 60 seconds. When the deposition time DT2 is 80 seconds or more, the fluctuation of the dislocation density Ne6 is large; and the flatness of the upper surface of the sixth layer 56 degrades. The relationship between the deposition time DT2 and the thickness of the second silicon-containing unit 62 was considered to be linear. In other words, the thickness of the second silicon-containing unit 62 is ⅓ atomic layers thick when the deposition time DT2 is 50 seconds.

The dislocation density Ne6 was higher for the case where the second silicon-containing unit 62 was not provided (DT2=0 seconds) than for the case where the second silicon-containing unit 62 was provided (DT2>0 seconds). Therefore, providing the silicon-containing units 61 and 62 is effective to reduce the dislocation density Ne6.

In the nitride semiconductor wafer 116, for example, the first silicon-containing unit 61 (e.g., SiN) can be provided on the fifth layer 55 with a substantially uniform thickness. Thereby, for example, in the case where the seventh layer 57 is the GaN layer, the GaN layer can be grown in an island configuration in a state in which the sizes of the crystals are uniform and the orientations of the crystal axes are substantially aligned.

When the cross section of the nitride semiconductor wafer 116 was observed by SEM (Scanning Electron Microscope), the second silicon-containing unit 62 (SiN) and the GaN layer were observed to have grown in an island configuration having uniform sizes. The first silicon-containing unit 61 was sufficiently small for the resolution of SEM. Therefore, the first silicon-containing unit 61 could not be observed by SEM. The islands of the GaN layer grown in the island configuration had, for example, triangular pyramid configurations and/or trapezoidal configurations. The islands were distributed substantially uniformly in the surface (the upper surface of the first silicon-containing unit 61). The height (length the Z-axis direction) was 300 nm to 700 nm for most of the islands.

For example, in the case where islands of GaN for which the sizes are nonuniform and the orientations of the crystal axes are not aligned are combined with each other, the flatness is poor; and the dislocation density does not decrease. Moreover, pits and dislocations occur at the interface portions where the islands did not combine well with each other, which may cause cracks.

Conversely, in the nitride semiconductor wafer 116, for example, relatively large GaN islands (e.g., islands having lengths in the Z-axis direction of 500 nm or more and lengths in a direction parallel to the X-Y plane of 700 nm or more) are formed in a state in which the sizes of the crystals and the orientations of the crystal axes are aligned. Thereby, in the nitride semiconductor wafer 116, it is considered that the dislocations decrease when the islands combine with each other.

The deposition time DT2 of the second silicon-containing unit 62 is shorter than the deposition time DT1 of the first silicon-containing unit 61. The second silicon-containing unit 62 is deposited, for example, on the upper portions and side surfaces of the GaN grown in the island configurations to make the shapes of the islands uniform. The deposition time DT2 of the second silicon-containing unit 62 is, for example, 50 seconds (e.g., not less than 40 seconds and not more than 120 seconds). When the deposition time DT2 is too long, for example, the GaN islands are etched too much; and the configurations become nonuniform. On the other hand, when the deposition time DT2 is too short, the shapes of the GaN islands cannot be made uniform; and the effect of reducing the dislocations is small. Thus, by combining the buffer unit BU with the two silicon-containing units 61 and 62, it is possible to form the sixth layer 56 (e.g., the GaN layer) that has a relatively thin film thickness, good flatness, and a low dislocation density.

Figure 19A:
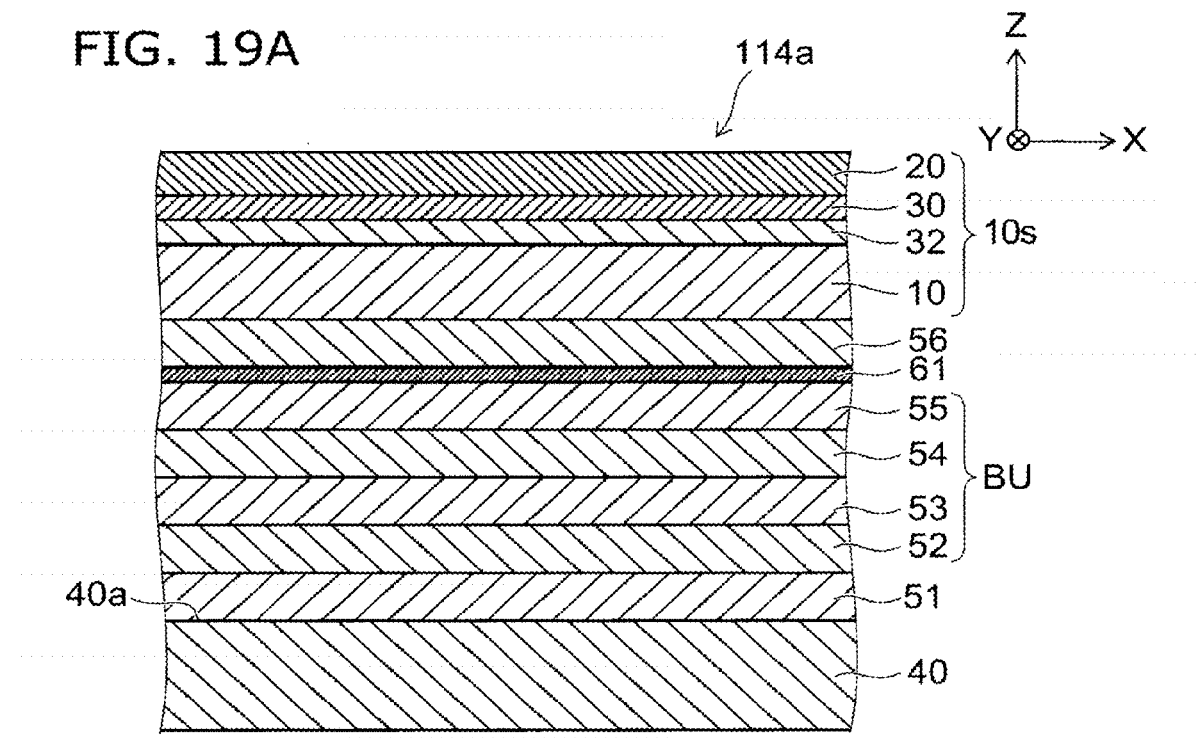
FIGS. 19A and 19B are cross-sectional views schematically showing other nitride semiconductor wafers according to the first embodiment.
Figure 19B:
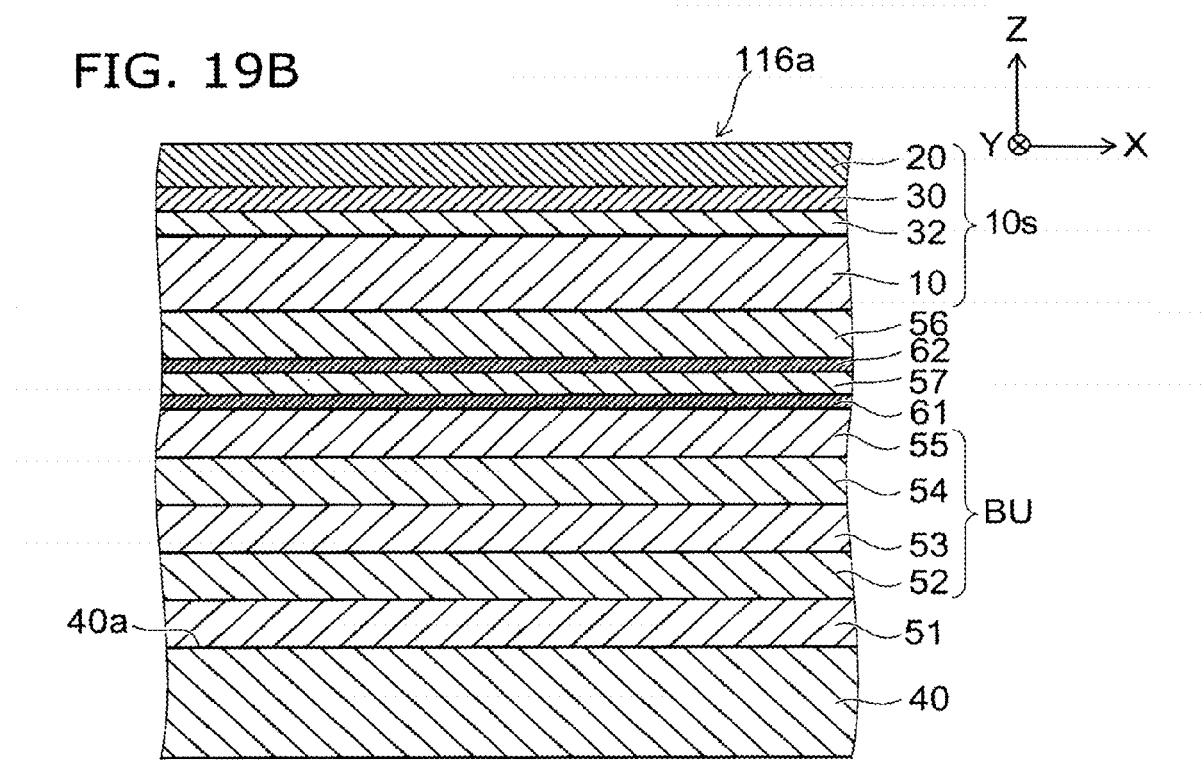

FIGS. 19A and 19B are cross-sectional views schematically showing other nitride semiconductor wafers according to the first embodiment.

In a nitride semiconductor wafer 114a as shown in FIG. 19A, the functional layer 10s is provided on the nitride semiconductor wafer 114.

In a nitride semiconductor wafer 116a as shown in FIG. 19B, the functional layer 10s is provided on the nitride semiconductor wafer 116.

Even in the case where the first silicon-containing unit 61 and/or the second silicon-containing unit 62 is provided, the functional layer 10s is provided, for example, on the sixth layer 56.

In the nitride semiconductor wafer 114a and the nitride semiconductor wafer 116a as well, the functional layer 10s includes, for example, the first semiconductor layer 10, the second semiconductor layer 20, the light emitting layer 30, and the stacked unit 32. For example, the sixth layer 56 may be the first semiconductor layer 10. In other words, the sixth layer 56 may be a portion of the functional layer 10s.

Second Embodiment

Figure 20:
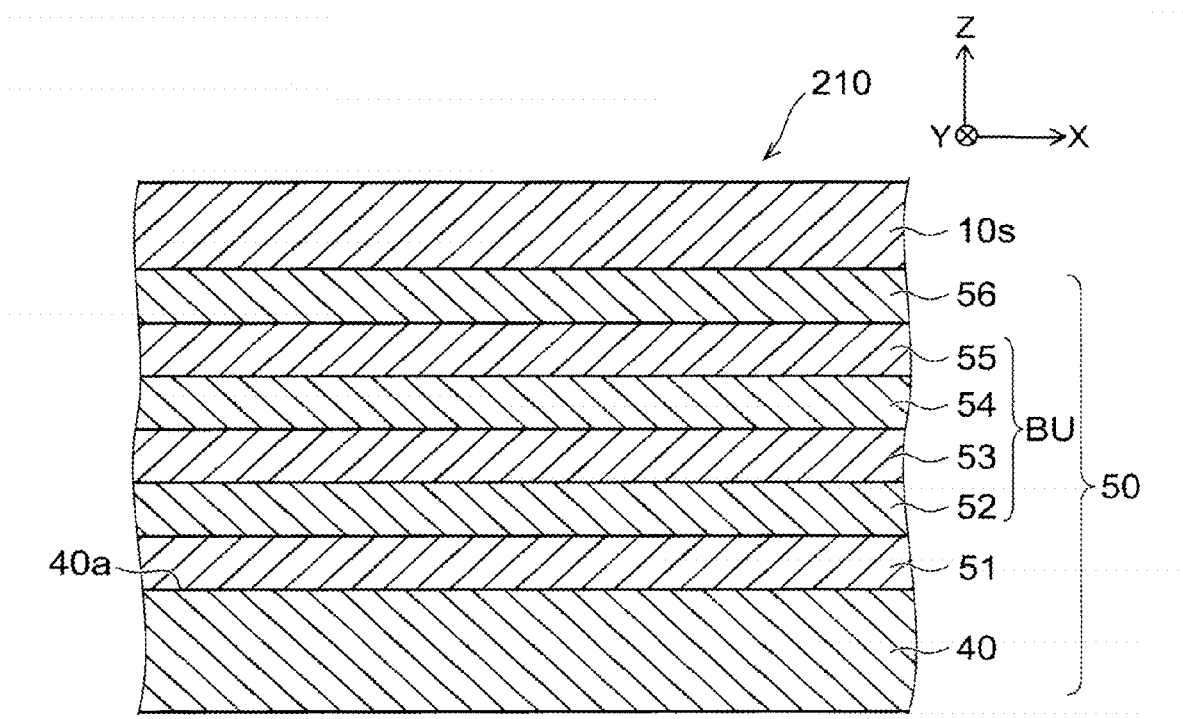
FIG. 20 is a cross-sectional view schematically showing a nitride semiconductor element according to a second embodiment.

FIG. 20 is a cross-sectional view schematically showing a nitride semiconductor element according to a second embodiment.

As shown in FIG. 20, the nitride semiconductor element 210 according to the embodiment includes the functional layer 10s.

The nitride semiconductor element 210 is manufactured using the nitride semiconductor wafer 110. The functional layer 10s is formed on a foundation layer 50. The foundation layer 50 includes, for example, a substrate and the first to sixth layers 51 to 56. The substrate 40, the first to sixth layers 51 to 56, and the functional layer 10s described in regard to the first embodiment are applicable.

Thereby, the nitride semiconductor element 210 in which cracks of the functional layer 10s are suppressed is provided.

There are cases where a portion of the foundation layer 50 is removed in the manufacturing processes of the nitride semiconductor element 210. For example, there are cases where the substrate 40 is removed and the first to fifth layers 51 to 55 remain. For example, there are cases where the substrate 40, the first to fifth layers 51 to 55, and a portion of the sixth layer 56 are removed and another portion of the sixth layer 56 remains. Or, there are cases where the entire foundation layer 50 is removed. In other words, the foundation layer 50 of the nitride semiconductor element 210 is omissible.

Third Embodiment

Figure 21:
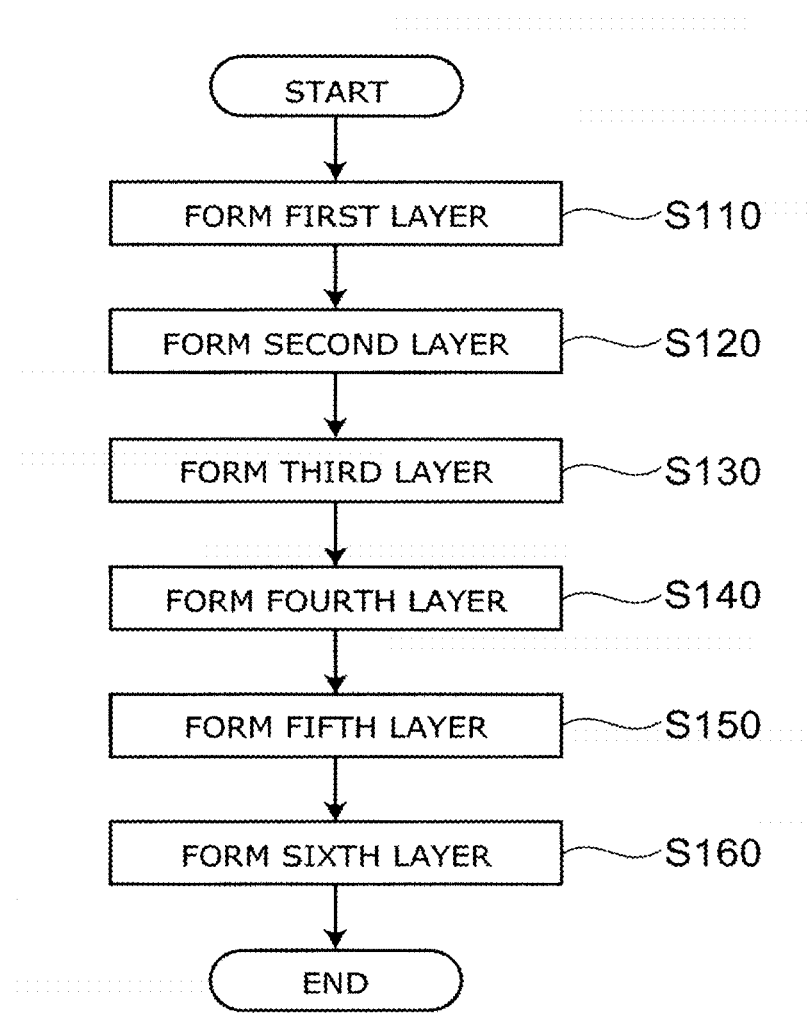
FIG. 21 is a flowchart showing a method for manufacturing a nitride semiconductor wafer according to a third embodiment.

FIG. 21 is a flowchart showing a method for manufacturing a nitride semiconductor wafer according to a third embodiment.

As shown in FIG. 21, the method for manufacturing the nitride semiconductor wafer according to the embodiment includes step S110 of forming the first layer 51, step S120 of forming the second layer 52, step S130 of forming the third layer 53, step S140 of forming the fourth layer 54, step S150 of forming the fifth layer 55, and step S160 of forming the sixth layer 56.

In step S110, for example, the processing described in regard to FIG. 15A is implemented. In step S120, for example, the processing described in regard to FIG. 15B is implemented. In step S130, for example, the processing described in regard to FIG. 15C is implemented. In step S140, for example, the processing described in regard to FIG. 15D is implemented. In step S150, for example, the processing described in regard to FIG. 15E is implemented. In step S160, for example, the processing described in regard to FIG. 15G is implemented.

Thereby, a nitride semiconductor wafer in which cracks of the sixth layer 56 is suppressed is manufactured.

In the embodiments, the growth of the semiconductor layers may include, for example, metal-organic chemical vapor deposition (MOCVD), metal-organic vapor phase epitaxy (MOVPE), molecular beam epitaxy (MBE), hydride vapor phase epitaxy (HVPE), etc.

For example, in the case where MOCVD or MOVPE is used, the following source materials may be used when forming the semiconductor layers. For example, TMGa (tri-methyl gallium) and TEGa (tri-ethyl gallium) may be used as the source material of Ga. For example, TMIn (tri-methyl indium), TEIn (tri-ethyl indium), etc., may be used as the source material of In. For example, TMAl (tri-methyl aluminum), etc., may be used as the source material of Al. For example, $NH_3$ (ammonia), MMHy (monomethylhydrazine), DMHy (dimethylhydrazine), etc., may be used as the source material of N. $SiH_4$ (monosilane), $Si_2H_6$ (disilane), etc., may be used as the source material of Si.

According to the embodiments, a nitride semiconductor wafer, a nitride semiconductor element, and a method for manufacturing the nitride semiconductor wafer in which cracks are suppressed are provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" include not only strictly perpendicular and strictly parallel but also, for example, the fluctuation due to manufacturing processes, etc.; and it is sufficient to be substantially perpendicular and substantially parallel. In the specification of the application, the state of being "provided on" includes not only the state of being provided in direct contact but also the state of being provided with another component inserted therebetween. The state of being "stacked" includes not only the state of overlapping in contact with each other but also the state of overlapping with another component inserted therebetween. The state of being "opposed" includes not only the state of directly facing each other but also the state of facing each other with another component inserted therebetween. In the specification of the application, being "electrically connected" includes not only the case of being connected in direct contact but also the case of being connected via another conductive member, etc.

Hereinabove, embodiments of the invention are described with reference to specific examples. However, the embodiments of the invention are not limited to these specific examples. For example, one skilled in the art may similarly practice the invention by appropriately selecting specific configurations of components included in the nitride semiconductor wafer and the nitride semiconductor element such as the substrate, the first to seventh layers, the first silicon-containing unit, the second silicon-containing unit, the functional layer, the foundation layer, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all nitride semiconductor wafers, nitride semiconductor elements, and methods for manufacturing nitride semiconductor wafer practicable by an appropriate design modification by one skilled in the art based on the nitride semiconductor wafers, the nitride semiconductor elements, and the methods for manufacturing nitride semiconductor wafer described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor element, comprising:
   a silicon substrate;
   a foundation layer including:
     a first layer of $Al_{x1}Ga_{1-x1}N$ ($0.8 \le x1 \le 1$) provided on the silicon substrate;
     a second layer of $Al_{x2}Ga_{1-x2}N$ ($0.7 \le x2 < 0.8$) provided on the first layer;
     a third layer of $Al_{x3}Ga_{1-x3}N$ ($0.4 \le x3 \le 0.6$) provided on the second layer;
     a fourth layer of $Al_{x4}Ga_{1-x4}N$ provided on the third layer;
     a fifth layer of $Al_{x5}Ga_{1-x5}N$ ($0.1 \le x5 \le 0.2$) provided on the fourth layer; and
     a sixth layer of $Al_{x6}Ga_{1-x6}N$ ($0 \le x6 < x5$) provided on the fifth layer; and
   a nitride semiconductor layer provided on the foundation layer,
   the composition ratio x4 of the fourth layer decreasing in a first direction from the third layer toward the fifth layer,
   a maximum value of the composition ratio x4 being not more than the composition ratio x3 of the third layer,
   a minimum value of the composition ratio x4 being not less than the composition ratio x5 of the fifth layer.

2. The element according to claim 1, wherein a length of the first layer in the first direction is not less than 150 nm and not more than 250 nm.

3. The element according to claim 1, wherein a length of the second layer in the first direction is not less than 80 nm and not more than 200 nm.

4. The element according to claim 1, wherein a length of the third layer in the first direction is not less than 80 nm and not more than 200 nm.

5. The element according to claim 1, wherein a length of the fourth layer in the first direction is not less than 500 nm and not more than 700 nm.

6. The element according to claim 1, wherein a length of the fifth layer in the first direction is not less than 100 nm and not more than 250 nm.

7. The element according to claim 1, wherein the sum of a length of the second layer in the first direction, a length of the third layer in the first direction, a length of the fourth layer in the first direction, and a length of the fifth layer in the first direction is not less than 800 nm and not more than 1200 nm.

8. The element according to claim 1, wherein
   the second layer contacts the first layer,
   the third layer contacts the second layer,
   the fourth layer contacts the third layer,
   the fifth layer contacts the fourth layer, and
   the sixth layer contacts the fifth layer.

9. The element according to claim 1, further comprising a first silicon-containing unit including silicon provided between the fifth layer and the sixth layer.

10. The element according to claim 9, wherein
    the second layer contacts the first layer,
    the third layer contacts the second layer,
    the fourth layer contacts the third layer,
    the fifth layer contacts the fourth layer,
    the first silicon-containing unit contacts the fifth layer, and
    the sixth layer contacts the first silicon-containing unit.

11. The element according to claim 9, further comprising:
    a seventh layer including $Al_{x7}Ga_{1-x7}N$ ($0 \le x7 < x5$) provided between the first silicon-containing unit and the sixth layer; and a second silicon-containing unit including silicon provided between the sixth layer and the seventh layer.

12. The element according to claim 11, wherein
the second layer contacts the first layer,
the third layer contacts the second layer,
the fourth layer contacts the third layer,
the fifth layer contacts the fourth layer,
the first silicon-containing unit contacts the fifth layer,
the seventh layer contacts the first silicon-containing unit,
the second silicon-containing unit contacts the seventh layer, and
the sixth layer contacts the second silicon-containing unit.

13. The element according to claim 1, wherein
the maximum value of the composition ratio x4 is the same as the composition ratio x3 of the third layer, and
the minimum value of the composition ratio x4 is the same as the composition ratio x5 of the fifth layer.

14. The element according to claim 13, wherein the nitride semiconductor layer includes:
a first semiconductor layer of a first conductivity type;
a light emitting layer provided on the first semiconductor layer; and
a second semiconductor layer of a second conductivity type provided on the light emitting layer.

15. The element according to claim 14, wherein
the light emitting layer includes:
a plurality of barrier layers; and
a plurality of well layers,
the barrier layers and the well layers are stacked alternately in the first direction, and
a bandgap energy each of the barrier layers is higher than a bandgap energy each of the well layers.

16. The element according to claim 14, wherein
the nitride semiconductor layer further includes a stacked unit provided between the first semiconductor layer and the light emitting layer,
the stacked unit includes:
a plurality of high bandgap energy layers; and
a plurality of low bandgap energy layers,
the high bandgap energy layers and the low bandgap energy layers are stacked alternately in the first direction, and
a bandgap energy each of the low bandgap energy layers is lower than a bandgap energy each of the high bandgap energy layers.

* * * * *